(12) United States Patent  
Nishiwaki et al.

(10) Patent No.: US 9,103,978 B2  
(45) Date of Patent: Aug. 11, 2015

(54) LIGHT-TRAPPING SHEET, AND LIGHT-RECEIVING DEVICE AND LIGHT-EMITTING DEVICE USING THE SAME

(71) Applicant: Panasonic Corporation, Osaka (JP)

(72) Inventors: Seiji Nishiwaki, Hyogo (JP); Shinichi Wakabayashi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 86 days.

(21) Appl. No.: 13/947,541

(22) Filed: Jul. 22, 2013

(65) Prior Publication Data

US 2013/0306844 A1    Nov. 21, 2013

Related U.S. Application Data

(63) Continuation of application No. PCT/JP2012/007082, filed on Nov. 5, 2012.

(30) Foreign Application Priority Data

Nov. 8, 2011 (JP) .................................. 2011-244603

(51) Int. Cl.
*G02B 6/124* (2006.01)
*G02B 5/18* (2006.01)
(Continued)

(52) U.S. Cl.
CPC ............. *G02B 5/1814* (2013.01); *G01J 1/0407* (2013.01); *G02B 5/0252* (2013.01); *G02B 6/124* (2013.01); *H01L 31/0543* (2014.12); *H01L 31/0547* (2014.12); *Y02E 10/52* (2013.01)

(58) Field of Classification Search
CPC ...................... G02B 6/124; G02B 2006/12107; G02B 5/1814; G02B 5/0252; H01L 31/054
See application file for complete search history.

(56) References Cited

U.S. PATENT DOCUMENTS

| 5,268,985 A | 12/1993 | Ando et al. |
| 5,877,874 A | 3/1999 | Rosenberg |

(Continued)

FOREIGN PATENT DOCUMENTS

| EP | 2 557 599 A1 | 2/2013 |
| JP | 05-224018 A | 9/1993 |

(Continued)

OTHER PUBLICATIONS

Co-pending U.S. Appl. No. 13/948,445, filed Jul. 23, 2013.

(Continued)

*Primary Examiner* — Jerry Rahll

(74) *Attorney, Agent, or Firm* — Renner, Otto, Boisselle & Sklar, LLP

(57) ABSTRACT

A light-trapping sheet of the present disclosure includes: a plurality of light-transmitting sheets each having first and second principal surfaces; and a plurality of light-coupling structures arranged in an inner portion of each of the plurality of light-transmitting sheets at a first and second distance from the first and second principal surfaces, respectively. Each of the plurality of light-coupling structures includes a first light-transmitting layer, a second light-transmitting layer, and a third light-transmitting layer sandwiched therebetween. A refractive index of the first and second light-transmitting layers is smaller than a refractive index of the light-transmitting sheet; and a refractive index of the third light-transmitting layer is larger than the refractive index of the first and second light-transmitting layers. The third light-transmitting layer has a diffraction grating parallel to the first and second principal surfaces of the light-transmitting sheet.

19 Claims, 25 Drawing Sheets

(51) Int. Cl.
*G02B 5/02* (2006.01)
*H01L 31/054* (2014.01)
*G01J 1/04* (2006.01)

(56) References Cited

U.S. PATENT DOCUMENTS

| | | |
|---|---|---|
| 6,654,532 B1 | 11/2003 | Tomaru et al. |
| 8,267,583 B2 * | 9/2012 | Yao et al. .................. 384/31 |
| 2005/0128592 A1 | 6/2005 | Nishii et al. |
| 2006/0126179 A1 | 6/2006 | Levola |
| 2006/0221448 A1 | 10/2006 | Nivon et al. |
| 2006/0228073 A1 | 10/2006 | Mukawa et al. |
| 2008/0239424 A1 | 10/2008 | Mukawa et al. |
| 2008/0298740 A1 | 12/2008 | Hlousek et al. |
| 2010/0220295 A1 | 9/2010 | Mukawa et al. |
| 2010/0329619 A1 | 12/2010 | Moore et al. |

FOREIGN PATENT DOCUMENTS

| | | |
|---|---|---|
| JP | 10-251038 A | 9/1998 |
| JP | 2001-510902 T | 8/2001 |
| JP | 2003-066203 A | 3/2003 |
| JP | 2003-248128 A | 9/2003 |
| JP | 2005-025208 A | 1/2005 |
| JP | 2005-037872 A | 2/2005 |
| JP | 2005-173116 A | 6/2005 |
| JP | 2007-538292 T | 12/2007 |
| JP | 2008-523434 T | 7/2008 |
| JP | 2008-535032 T | 8/2008 |
| JP | 2011-222735 A | 11/2011 |
| WO | 2005/093493 A1 | 10/2005 |
| WO | 2007/137438 A1 | 12/2007 |
| WO | 2009/005072 A1 | 1/2009 |
| WO | 2010/151253 A1 | 12/2010 |
| WO | 2012/046414 A1 | 4/2012 |

OTHER PUBLICATIONS

Co-pending U.S. Appl. No. 13/948,462, filed Jul. 23, 2013.
International Search Report for corresponding International Application No. PCT/JP2012/007082 mailed Jan. 15, 2013.
Form PCT/ISA/237 for corresponding International Application No. PCT/JP2012/007082 dated Jan. 15, 2013 and partial English translation.
Hiroshi Nishihara et al., "Optical Integrated Circuits", p. 94, p. 243, Ohmsha Ltd. and concise explanation.
Co-pending U.S. Appl. No. 13/877,362, filed Apr. 2, 2013.

* cited by examiner

FIG. 5A  $\lambda=0.45, \theta=5$
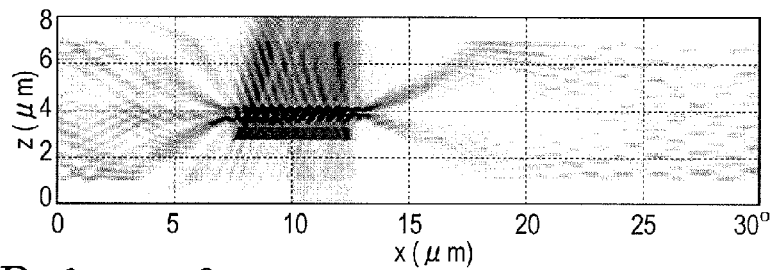
FIG. 5B  $\lambda=0.55, \theta=0$
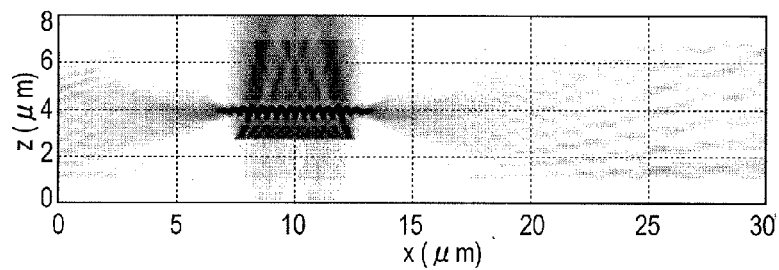
FIG. 5C  $\lambda=0.55, \theta=10$
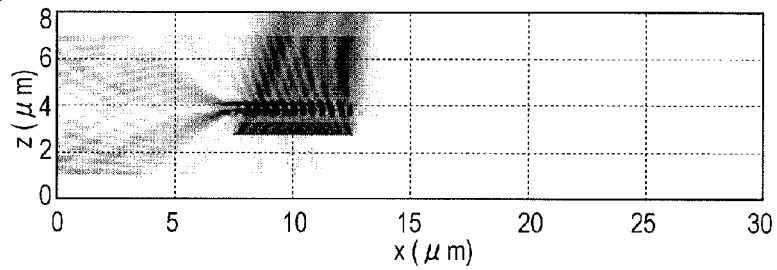
FIG. 5D  $\lambda=0.65, \theta=10$
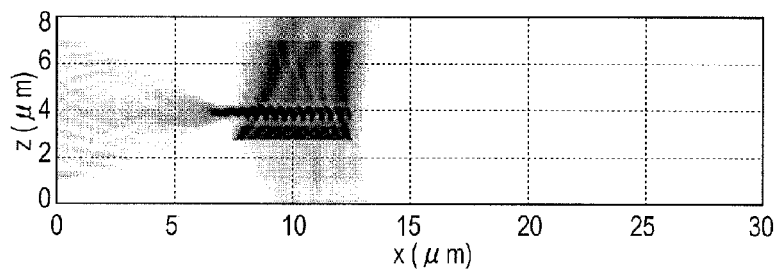
FIG. 5E  $\lambda=0.65, \theta=20$
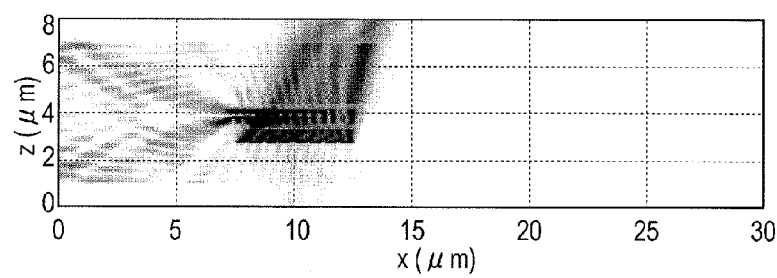

FIG.12A    λ=0.45,d=0.18
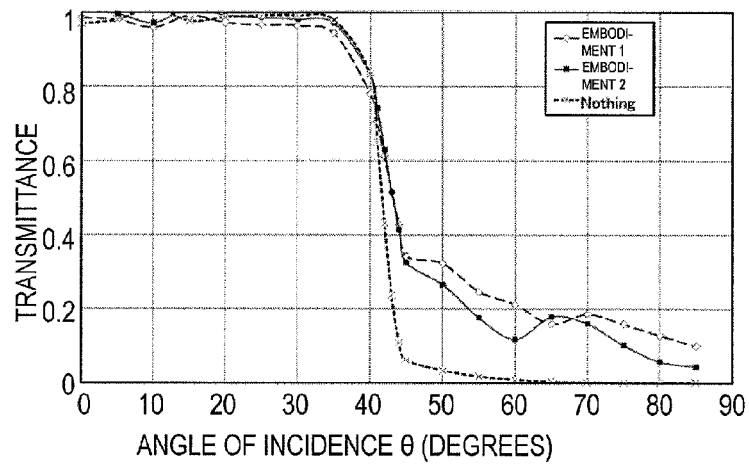
FIG.12B    λ=0.55,d=0.18
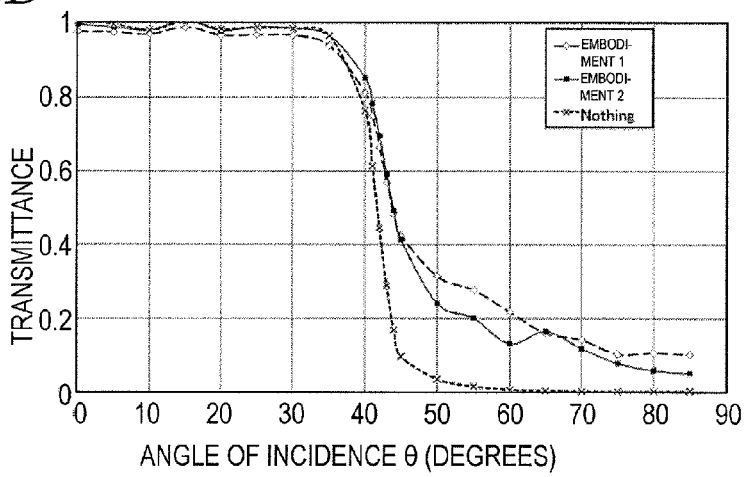
FIG.12C    λ=0.65,d=0.18
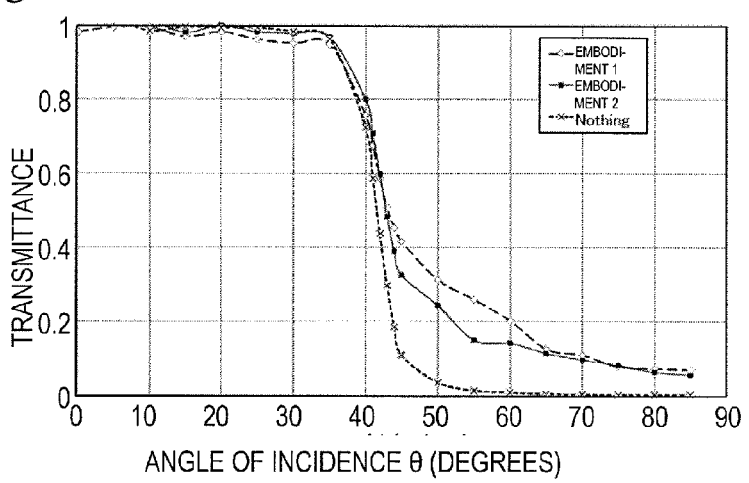

25A, 25a 25B,25B', 25b,25b'

US 9,103,978 B2

LIGHT-TRAPPING SHEET, AND LIGHT-RECEIVING DEVICE AND LIGHT-EMITTING DEVICE USING THE SAME

This is a continuation of International Application No. PCT/JP2012/007082, with an international filing date of Nov. 5, 2012, which claims priority of Japanese Patent Application No. 2011-244603, filed on Nov. 8, 2011, the contents of which are hereby incorporated by reference.

BACKGROUND

1. Technical Field

The present disclosure relates to a light-trapping sheet for allowing light-trapping utilizing diffraction, and to a light-receiving device and a light-emitting device using the same.

2. Description of the Related Art

Where light is propagated between two light-propagating media of different refractive indices, since there is transmission and reflection of light at the interface, it is typically difficult to transfer, with a high efficiency, light from one light-propagating medium to the other light-propagating medium and maintain this state. A conventional grating coupling method shown in "Optical Integrated Circuits", p 94, p 243, Hiroshi Nishihara, et al. Ohmsha Ltd., for example, can be mentioned as a technique for taking light into a transparent sheet from an environmental medium such as the air. FIGS. 27A and 27B are diagrams illustrating the principle of the grating coupling method, showing a cross-sectional view and a plan view of a light-transmitting layer 20 with a linear grating of a pitch Λ provided on a surface thereof. As shown in FIG. 27A, if light 23a of a wavelength λ is allowed to enter the grating at a particular angle of incidence θ, it can be coupled to guided light 23B propagating inside the light-transmitting layer 20.

SUMMARY

However, according to the method disclosed in "Optical Integrated Circuits", p 94, p 243, Hiroshi Nishihara, et al. Ohmsha Ltd., only light that satisfies predetermined conditions can be taken into the light-transmitting layer 20, and light that falls out of the conditions is not taken in.

It is an object of an embodiment of the present disclosure to provide a light-trapping sheet capable of taking in light. It is also an object to provide a light-receiving device and a light-emitting device using the same.

In one general aspect, a light-trapping sheet of the present disclosure includes: a plurality of light-transmitting sheets each having first and second principal surfaces; and a plurality of light-coupling structures arranged in an inner portion of each of the plurality of light-transmitting sheets at a first and second distance from the first and second principal surfaces, respectively. Each of the plurality of light-coupling structures includes a first light-transmitting layer, a second light-transmitting layer, and a third light-transmitting layer sandwiched therebetween; a refractive index of the first and second light-transmitting layers is smaller than a refractive index of the light-transmitting sheet; a refractive index of the third light-transmitting layer is larger than the refractive index of the first and second light-transmitting layers; and the third light-transmitting layer has a diffraction grating parallel to the first and second principal surfaces of the light-transmitting sheet.

In another aspect, a light-receiving device of the present disclosure includes: a light-trapping sheet as set forth above; and a photoelectric conversion section provided on the first principal surface or the second principal surface of the light-trapping sheet, or side surfaces adjacent to these principal surfaces.

In another aspect, a light-receiving device of the present disclosure includes: a light-trapping sheet as set forth above; and a protrusion/depression (diffraction) structure or a prism sheet provided on the first principal surface or the second principal surface of the light-trapping sheet, and a photoelectric conversion section for receiving light output from the protrusion/depression structure or the prism sheet.

According to an embodiment of the present disclosure, it is possible to efficiently take in light by utilizing total reflection of light.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIGS. 4A to 4D show results of an analysis conducted using the structure shown in FIG. 3, wherein FIGS. 4A to 4C show the relationship between the angle of incidence of light and the transmittance thereof out of the sheet, and FIG. 4D shows the relationship between the groove depth of the diffraction grating and the light take-out efficiency out of the sheet.

FIGS. 5A to 5E are diagrams showing light intensity distributions on the sheet cross section under conditions at positions indicated by arrows in FIGS. 4A to 4C.

FIGS. 6A to 6D show results of an analysis with the structure shown in FIG. 3 where the refractive index of a first light-transmitting layer 3a and a second light-transmitting layer 3b is made equal to the refractive index of the light-transmitting sheet, and the refractive index of the third light-transmitting layer 3c is set to 2.0, wherein FIG. 6A to 6C show the relationship between the angle of incidence and the transmittance thereof out of the sheet, and FIG. 6D shows the relationship between the groove depth of the diffraction grating and the light take-out efficiency out of the sheet.

FIG. 11D shows the relationship between the groove depth of the diffraction grating and the light take-out efficiency out of the sheet.

FIGS. 12A to 12C show results of an analysis conducted using the structures shown in FIGS. 3 and 10 where the position of the light source is shifted by 5 μm in the x-axis negative direction, wherein FIGS. 12A to 12C each show the relationship between the angle of incidence of light on the end face of a single light-coupling structure and the transmittance thereof out of the sheet.

FIG. 16D shows the relationship between the groove depth of the diffraction grating and the light take-out efficiency out of the sheet.

DESCRIPTION OF EMBODIMENTS

First, thoughts by the present inventors on the problems with conventional techniques set forth above will be presented.

Figure 27A:
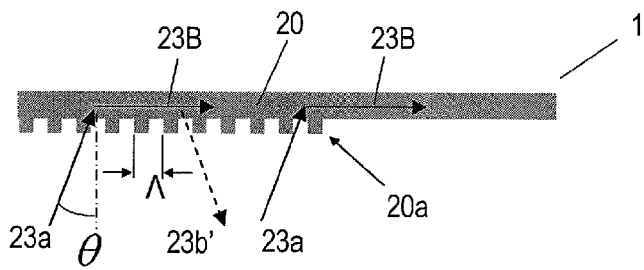
FIGS. 27A and 27B are a cross-sectional view and a plan view of a linear grating for taking in light by a grating coupling method.
Figure 27B:
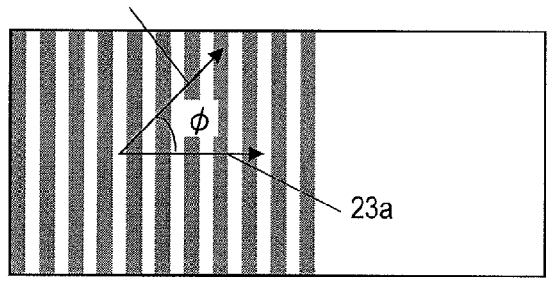
Figure 27C:
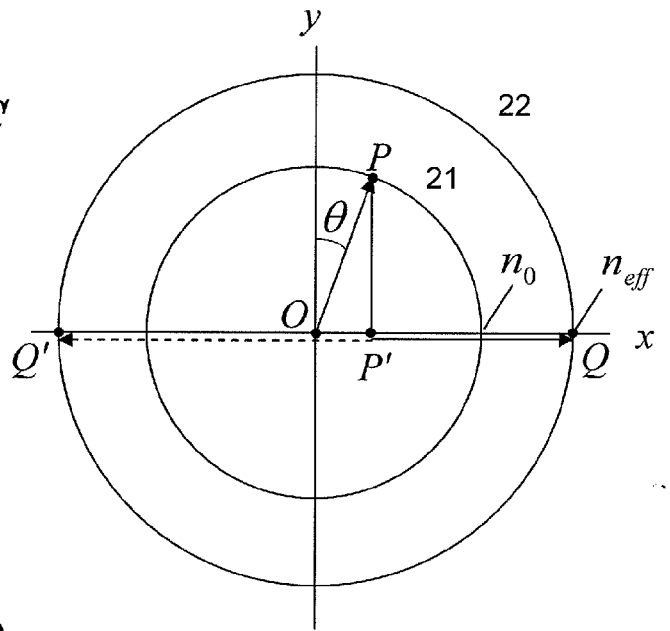
FIGS. 27C and 27D are diagrams showing the principle of the grating coupling method.
Figure 27D:
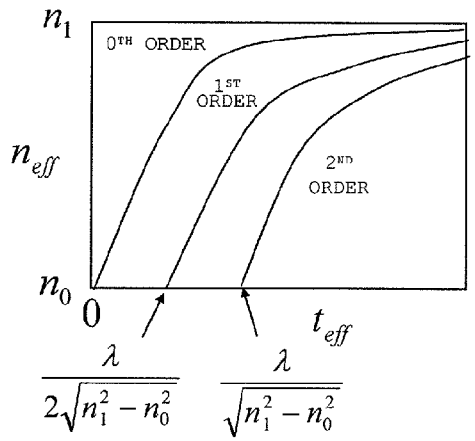

FIG. 27C shows a vector diagram of light incident on the grating provided on the light-transmitting layer 20. In FIG. 27C, circles 21 and 22 are centered about point O, wherein the radius of the circle 21 is equal to the refractive index $n_0$ of an environmental medium 1 surrounding the light-transmitting layer 20, and the radius of the circle 22 is equal to the equivalent refractive index $n_{eff}$ of the guided light 23B. The equivalent refractive index $n_{eff}$ is dependent on the thickness of the light-transmitting layer 20, and takes a particular value, depending on the waveguide mode, between the refractive index $n_0$ of an environmental medium 1 and the refractive index $n_1$ of the light-transmitting layer 20. FIG. 27D shows a relationship between the effective thickness $t_{eff}$ and the equivalent refractive index $n_{eff}$ in a case where light propagates in the TE mode through the light-transmitting layer 20. The effective thickness is equal to the thickness of the light-transmitting layer 20 where there is no grating, and if there is a grating, it is the thickness of the light-transmitting layer 20 plus the average height of the grating. Induced guided light has modes such as zeroth, first, second, and so forth, which have different characteristic curves as shown in FIG. 27D. In FIG. 27C, point P is a point at which a line drawn from point O along the angle of incidence θ crosses the circle 21, point P' is the foot of a perpendicular from point P to the x axis, and points Q and Q' are points at which the circle 22 crosses the x axis. The condition for light coupling in the x-axis positive direction is represented by the length of P'Q being equal to an integral multiple of λ/Λ, and the condition for light coupling in the negative direction is represented by the length P'Q' being equal to an integral multiple of λ/Λ. Note however that λ is the wavelength of light, and Λ is the pitch of the grating. That is, the condition for light coupling is represented by Expression 1.

[Exp. 1]

$$\sin\theta = \pm n_{eff} + q\frac{\lambda}{\Lambda} \quad (1)$$

where q is the diffraction order represented by an integer. At an angle of incidence other than θ defined by Expression 1, light is not coupled into the light-transmitting layer 20. Even with the same angle of incidence θ, light is not coupled for different wavelengths.

Note that as shown in FIG. 27B, for light 23aa incident on the light-transmitting layer 20 at an azimuthal angle φ that is shifted by an angle φ from the direction of incidence of the light 23a, the essential pitch of the grating of the light-transmitting layer 20 is Λ/cos φ. Therefore, for the light 23a incident at a different azimuth, the condition for light coupling can be satisfied even with an angle of incidence θ and a wavelength that are different from those defined by Expression 1. That is, where changes in the azimuth of light incident on the light-transmitting layer 20 are tolerated, the condition for light coupling shown by Expression 1 is somewhat widened. However, incident light cannot be coupled to the guided light 23B over a wide wavelength range for every angle of incidence.

The guided light 23B, while propagating through the grating area, radiates light 23b' in the same direction as reflected light of the incident light 23a. Therefore, even if light is incident at a position far away from an end portion 20a of the grating and propagates through the light-transmitting layer 20 as the guided light 23B, it attenuates by the time it reaches the end portion 20a of the grating. Therefore, only the light 23a that is incident at a position close to the end portion 20a of the grating can propagate through the light-transmitting layer 20 as the guided light 23B without being attenuated by the radiation. That is, even if the area of the grating is increased in order to couple a large amount of light, it is not possible to allow all the light incident on the grating to propagate as the guided light 23B.

With a light-trapping sheet according to an embodiment of the present disclosure, light incident on the light-transmitting sheet enters a light-coupling structure arranged in an inner portion thereof, and is converted by the diffraction grating of the third light-transmitting layer in the light-coupling structure to light that propagates in the direction along the third light-transmitting layer to be radiated from the end face of the light-coupling structure. Since the light-coupling structure is in such a positional relationship that it is parallel to the light-transmitting sheet surface, and light that is radiated from the light-coupling structure is repeatedly totally reflected between the surface of the light-transmitting sheet and surfaces of other light-coupling structures, to be confined within the light-transmitting sheet. A light-trapping sheet is formed by layering together a plurality of such light-transmitting sheets. This allows for efficient photoelectric conversion of light taken in.

(First Embodiment)

Figure 1A:
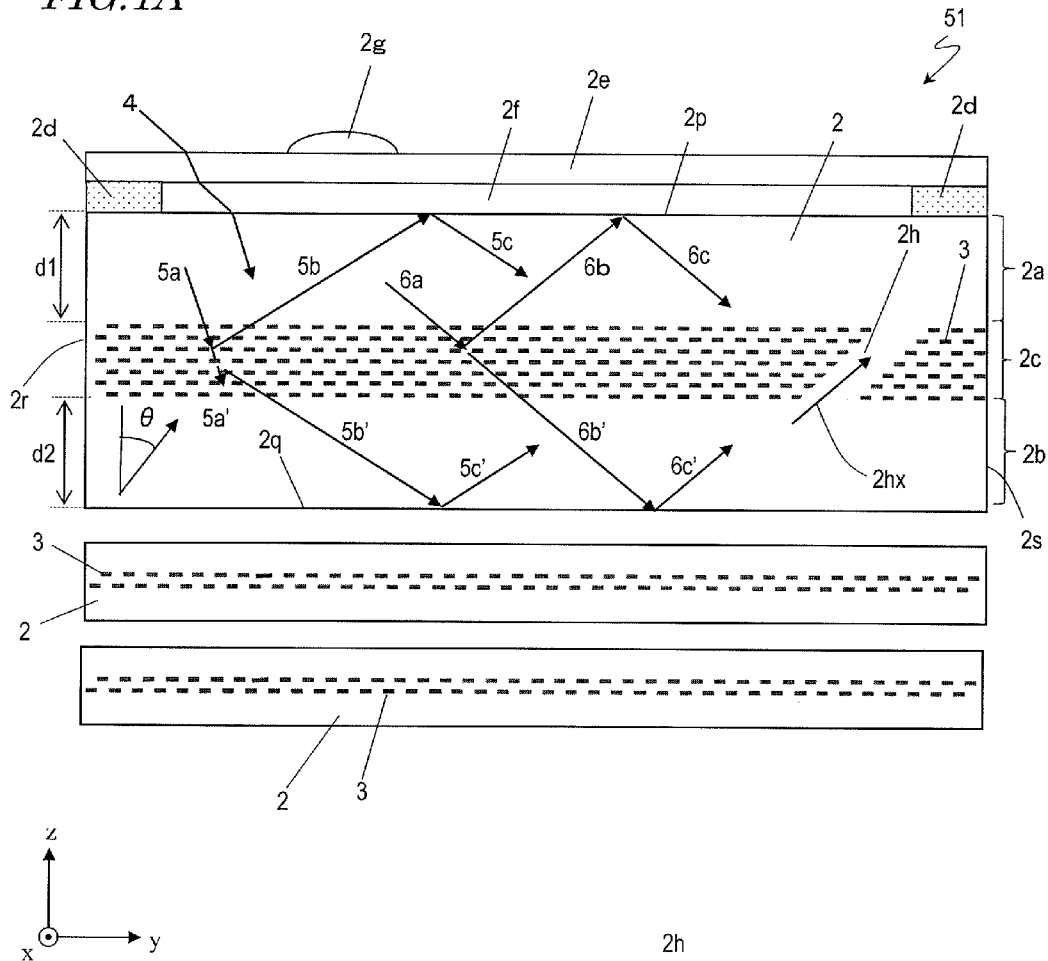
FIG. 1A is a schematic cross-sectional view showing a first embodiment of a light-trapping sheet according to the present disclosure.

A first embodiment of a light-trapping sheet according to the present disclosure will be described. FIG. 1A is a schematic cross-sectional view of a light-trapping sheet 51. The light-trapping sheet 51 includes a plurality of light-transmitting sheets 2 each having a first principal surface 2p and a second principal surface 2q, and a plurality of light-coupling structures 3 provided in each light-transmitting sheet 2. The plurality of light-transmitting sheets 2 are layered together. That is, the plurality of light-transmitting sheets are arranged next to each other in a direction perpendicular to the first principal surface 2p and the second principal surface 2q. Herein, "perpendicular" does not need to be mathematically strictly perpendicular. The term "perpendicular" as used in the present specification is meant to include cases where the direction is inclined by 10 degrees or less with respect to the strictly perpendicular direction. In FIG. 1A, for the sake of simplicity, the uppermost light-transmitting sheet 2 is depicted to be thicker than the other light-transmitting sheets 2 so as to show, in detail, the configuration of the light-transmitting sheet 2. The light-transmitting sheets 2 to be layered together typically have the same thickness and the same structure. However, a plurality of light-transmitting sheets 2 that together form one light-trapping sheet do not need to have the same thickness and the same structure.

The light-transmitting sheet 2 is formed by a transparent material that transmits light of a desired wavelength or within a desired wavelength range determined according to the application. For example, it is formed by a material that transmits visible light (wavelength: 0.4 μm or more and 0.7 μm or less). The thickness of the light-transmitting sheet 2 is about 0.03 mm to 1 mm, for example. There is no particular limitation on the size of the first principal surface 2p and the second principal surface 2q, and they each have an area determined according to the application. In the illustrated example, a cover sheet 2e is bonded to one of the light-transmitting sheets 2 located at the outermost surface, with a spacer 2d sandwiched therebetween. Therefore, most of the first principal surface 2p (or the second principal surface 2q) of the light-transmitting sheet 2 is in contact with a buffer layer 2f. The spacer 2d is formed by a material having a lower refractive index than the light-transmitting sheet 2, such as an aerogel. The thickness of the cover sheet 2e is about 0.1 mm to 1.0 mm, for example.

As shown in FIG. 1A, the light-coupling structures 3 are arranged in an inner portion of each light-transmitting sheet 2 at a first distance d1 or more and a second distance d2 or more from the first principal surface 2p and the second principal surface 2q, respectively. Therefore, in the light-transmitting sheet 2, the light-coupling structure 3 is not provided in a first area 2a that is in contact with the first principal surface 2p and has a thickness of the first distance d1, and in a second area 2b that is in contact with the second principal surface 2q and has a thickness of the second distance d2, and the light-coupling structure 3 is provided in a third area 2c sandwiched between the first area 2a and the second area 2b.

The light-coupling structures 3 are three-dimensionally arranged in the third area 2c of the light-transmitting sheet 2. Preferably, the light-coupling structures 3 are two-dimensionally arranged on a surface parallel to the first principal surface 2p and the second principal surface 2q, and a plurality of sets of the two-dimensionally-arranged light-coupling structures 3 are layered together in the thickness direction of the light-transmitting sheet 2. Herein, "parallel" does not need to be mathematically strictly parallel. The term "parallel" as used in the present specification is meant to include cases where the direction is inclined by 10 degrees or less with respect to the strictly parallel direction.

The light-coupling structures 3 are arranged with a predetermined density in the x,y-axis direction (in-plane direction) and the z-axis direction (thickness direction). For example, the density is 10 to $10^3$ per 1 mm in the x-axis direction, 10 to $10^3$ per 1 mm in the y-axis direction, and about 10 to $10^3$ per 1 mm in the z-axis direction. In order to efficiently take in light illuminating the entirety of the first principal surface 2p and the second principal surface 2q of the light-transmitting sheet 2, the density with which the light-coupling structures 3 are arranged in the x-axis direction of the light-transmitting sheet 2, that in the y-axis direction and that in the z-axis direction may be independent of one another and uniform. Note however that depending on the application or the distribution of light illuminating the first principal surface 2p and the second principal surface 2q of the light-transmitting sheet 2, the arrangement of the light-coupling structures 3 in the light-transmitting sheet 2 may not be uniform and may have a predetermined distribution.

Figure 2A:
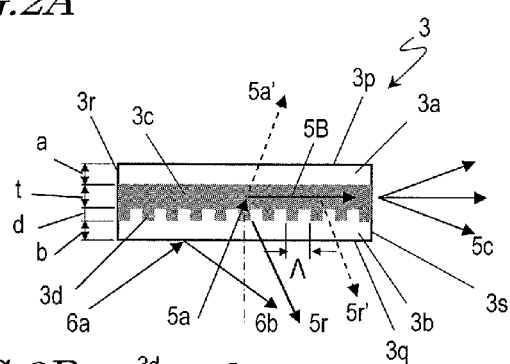
FIGS. 2A and 2B are schematic cross-sectional views and a plan view showing a light-coupling structure of the first embodiment.
Figure 2C:
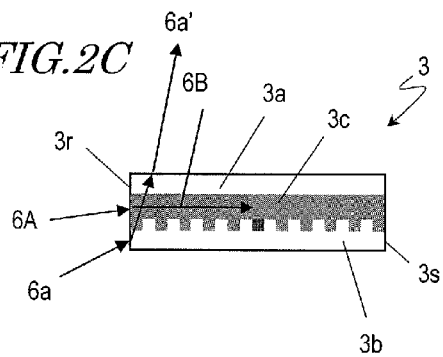
FIG. 2C is a cross-sectional view showing light being incident on an end face of the light-coupling structure.
Figure 2B:
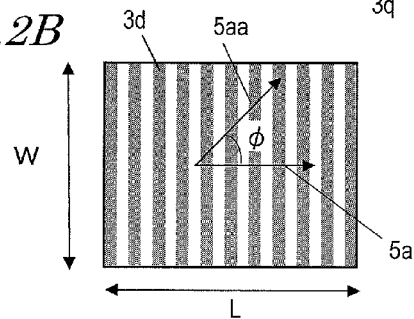

FIGS. 2A and 2B are a cross-sectional view along the thickness direction of the light-coupling structure 3, and a plan view orthogonal thereto. The light-coupling structure 3 includes a first light-transmitting layer 3a, a second light-transmitting layer 3b, and a third light-transmitting layer 3c sandwiched therebetween. The first light-transmitting layer 3a, the second light-transmitting layer 3b, and the third light-transmitting layer 3c sandwiched therebetween are layered together in a direction perpendicular to the first and second principal surfaces. The third light-transmitting layer 3c includes a diffraction grating 3d having a linear grating of the pitch Λ provided on the reference plane. The linear grating of the diffraction grating 3d may be formed by protrusions/ depressions provided at the interface between the third light-transmitting layer 3c and the first light-transmitting layer 3a or the second light-transmitting layer 3b, or may be provided inside the third light-transmitting layer 3c as shown in FIG. 2E. It may be a grating based on refractive index differences, instead of a grating with protrusions/depressions. In the light-coupling structure 3, the diffraction grating 3d of the third light-transmitting layer 3c is arranged in the light-transmitting sheet 2 so as to be parallel to the first principal surface 2p and the second principal surface 2q of the light-trapping sheet 51. Herein, the diffraction grating being parallel to the first principal surface 2p and the second principal surface 2q means that the reference plane on which the grating is provided is parallel to the first principal surface 2p and the second principal surface 2q.

In one embodiment, where a plurality of light-coupling structures 3 are arranged on a surface parallel to the first principal surface 2p and the second principal surface 2q, they are arranged so that at least the first light-transmitting layer 3a and the second light-transmitting layer 3b are spaced apart from each other. That is, where a plurality of light-coupling structures 3 include a first light-coupling structure and a second light-coupling structure that are two-dimensionally arranged next to each other on a surface parallel to the first and second principal surfaces (2p, 2q), the first and/or second light-transmitting layer (3a, 3b) of the first light-coupling structure is/are spaced apart from the first and/or second light-transmitting layer (3a, 3b) of the second light-coupling structure. Herein, the first and/or second light-transmitting layer (3a, 3b) of first light-coupling structure being spaced apart from the first and/or second light-transmitting layer (3a, 3b) of the second light-coupling structure means to include any of the following cases. That is, a case where the first light-transmitting layer 3a of the first light-coupling structure and the first light-transmitting layer 3a of the second light-coupling structure are spaced apart from each other; a case where the second light-transmitting layer 3b of the first light-coupling structure and the second light-transmitting layer 3b of the second light-coupling structure are spaced apart from each other; and a case where the first and second light-transmitting layers (3a, 3b) of the first light-coupling structure and the first and second light-transmitting layers (3a, 3b) of the second light-coupling structure are spaced apart from each other. The third light-transmitting layers 3c may be arranged to be spaced apart from each other, or may be arranged to be continuous with each other. In order to facilitate the manufacturing process, the third light-transmitting layers 3c may be arranged to be continuous with each other. That is, the third light-transmitting layer of the first light-coupling structure and the third light-transmitting layer of the second light-coupling structure may be continuous with each other.

Where a plurality of light-coupling structures 3 are arranged in the thickness direction of the light-transmitting sheet 2, they are arranged to be spaced apart from each other. For example, where the second light-transmitting layer of the second light-coupling structure is present above the first light-transmitting layer of the first light-coupling structure, the first light-transmitting layer of the first light-coupling structure and the second light-transmitting layer of the second light-coupling structure are arranged to be spaced apart from each other.

The thicknesses of the first light-transmitting layer 3a, the second light-transmitting layer 3b and the third light-transmitting layer 3c are a, b and t, respectively, and the step (depth) of the linear diffraction grating of the third light-transmitting layer 3c is d. The surface of the third light-transmitting layer 3c is parallel to the first principal surface 2p and the second principal surface 2q of the light-transmitting sheet 2, and surfaces 3p and 3q of the first light-transmitting layer 3a and the second light-transmitting layer 3b that are located on the opposite side from the third light-transmitting layer 3c are also parallel to the first principal surface 2p and the second principal surface 2q of the light-transmitting sheet 2.

As will be described below, in order to be able to take in light of different wavelengths incident on the light-trapping sheet, the light-trapping sheet 51 may include a plurality of light-coupling structures 3, and at least two of the plurality of light-coupling structures may differ from each other in terms of the direction in which the diffraction grating 3d extends. Alternatively, at least two of the plurality of light-coupling structures 3 may differ from each other in terms of the pitch Λ of the diffraction grating 3d. Alternatively, a combination thereof may be used.

The refractive index of the first light-transmitting layer 3a and the second light-transmitting layer 3b is smaller than the refractive index of the light-transmitting sheet 2, and the refractive index of the third light-transmitting layer 3c is larger than the refractive index of the first light-transmitting layer 3a and the second light-transmitting layer 3b. Hereinbelow, it is assumed that the first light-transmitting layer 3a and the second light-transmitting layer 3b are the air, and the refractive index thereof is 1. It is also assumed that the third light-transmitting layer 3c is formed by the same medium as the light-transmitting sheet 2, and they have an equal refractive index.

The surfaces 3p and 3q of the first light-transmitting layer 3a and the second light-transmitting layer 3b of the light-coupling structure 3 are each a rectangular of which two sides are the lengths W and L, for example, and W and L are 3 μm or more and 100 μm or less. That is, the surfaces of the first light-transmitting layer 3a and the second light-transmitting layer 3b of the light-coupling structure 3 are each sized so as to circumscribe a circle having a diameter of 3 μm or more and 100 μm or less. The thickness (a+t+d+b) of the light-coupling structure 3 is 3 μm or less. While the surface (plane) of the light-coupling structure 3 has a rectangular shape as shown in FIG. 2B in the present embodiment, it may have a different shape, e.g., a polygonal shape, a circular shape, or an elliptical shape.

The light-trapping sheet 51 is used while being surrounded by an environmental medium. For example, the light-trapping sheet 51 is used in the air. In this case, the refractive index of the environmental medium is 1. Hereinbelow, the refractive index of the light-transmitting sheet 2 is assumed to be $n_s$. Light 4 from the environmental medium passes through the cover sheet 2e and the buffer layer 2f, and enters the inside of the light-transmitting sheet 2 through the first principal surface 2p and the second principal surface 2q of the light-transmitting sheet 2 located at the outermost surface. The buffer layer 2f is formed by the same medium as the environmental medium, and the refractive index thereof is 1. The refractive index of the spacer 2d is substantially equal to 1. An AR coat or anti-reflective nanostructures may be formed on the opposite surfaces of the cover sheet 2e, the first principal surface 2p and the second principal surface 2q in order to increase the transmittance of the incident light 4. The anti-reflective nanostructures include minute protrusion/depression (diffraction) structures, such as moth-eye structures, whose pitch and height are ⅓ or less the design wavelength. The design wavelength is the wavelength of light used when designing the various elements so that the light-trapping sheet 51 exhibits a predetermined function. Note that with anti-reflective nanostructures, Fresnel reflection is reduced but total reflection is present. Between a plurality of light-transmitting sheets 2, there are areas where they are partially in contact with each other with their surfaces running substantially parallel to each other. Out-of-critical-angle light is exchanged therebetween via these contact surfaces. Thus, layering light-transmitting sheets 2 together gives an advantage equivalent to that of increasing the number or density of light-coupling structures 3, and enhances the light-confining effect.

Hereinbelow, of the light present inside the light-transmitting sheet 2, light that satisfies $\sin \theta < 1/n_s$ will be referred to as the in-critical-angle light and light that satisfies $\sin \theta \geq 1/n_s$ as the out-of-critical-angle light, regarding the angle $\theta$ (hereinafter referred to as the propagation angle) formed between the propagation azimuth thereof and the normal to the light-transmitting sheet 2 (a line perpendicular to the first principal surface 2p and the second principal surface 2q). In FIG. 1A, where in-critical-angle light 5a is present inside the light-transmitting sheet 2, a portion thereof is converted by a light-coupling structure 3 to out-of-critical-angle light 5b, and this light is totally reflected by the first principal surface 2p to be out-of-critical-angle light 5c that stays inside the sheet. A portion of the remaining in-critical-angle light 5a' of the in-critical-angle light 5a is converted by another light-coupling structure 3 to out-of-critical-angle light 5b', and this light is reflected by the second principal surface 2q to be out-of-critical-angle light 5c' that stays inside the sheet. Thus, all of the in-critical-angle light 5a is converted to the out-of-critical-angle light 5b or 5b' inside the third area 2c where the light-coupling structures 3 are arranged.

On the other hand, where out-of-critical-angle light 6a is present in the light-transmitting sheet 2, a portion thereof is totally reflected by the surface of a light-coupling structure 3 to be out-of-critical-angle light 6b, and this light is totally reflected by the first principal surface 2p to be out-of-critical-angle light 6c that stays inside the sheet. A portion of the remaining light of the light 6a becomes out-of-critical-angle light 6b' that passes through the third area 2c where the light-coupling structures 3 are provided, and this light is totally reflected by the second principal surface 2q to be out-of-critical-angle light 6c' that stays inside the light-transmitting sheet 2. Although not shown in the figure, there is also out-of-critical-angle light that stays inside the sheet while being totally reflected between different light-coupling structures 3 and between the first principal surface 2p and the second principal surface 2q, i.e., light that propagates through, while staying in, the first area 2a, the second area 2b or the third area 2c. In this case, there may occur a deviation in the distribution of light propagating through the first area 2a and the second area 2b. Where the deviation in the distribution of light in the light-transmitting sheet 2 is problematic, one or more fourth area 2h may be provided, in the third area 2c in the light-transmitting sheet 2, where no light-coupling structure 3 is provided, as shown in FIG. 1A. That is, the light-coupling structures 3 are arranged only in the third area 2c excluding the fourth area 2h. In the light-transmitting sheet 2, the fourth area 2h connects between the first area 2a and the second area 2b. The fourth area 2h extends from the first area 2a to the second area 2b, or in the opposite direction, and the azimuth of an arbitrary straight line passing through the fourth area 2h is along a larger angle than a critical angle that is defined by the refractive index of the light-transmitting sheet and the refractive index of the environmental medium around the light-transmitting sheet. That is, assuming that the refractive index of the environmental medium is 1 and the refractive index of the light-transmitting sheet 2 is $n_e$, the angle $\theta'$ of the direction 2hx in which the arbitrary straight line passing through the fourth area 2h extends with respect to the normal to the light-transmitting sheet 2 satisfies $\sin \theta' \geq 1/n_s$. Herein, a straight line passing through the fourth area 2h refers to the straight line penetrating the surface at which the fourth area 2h is in contact with the first area 2a and the surface at which the fourth area 2h is in contact with the second area 2b.

Figure 1B:
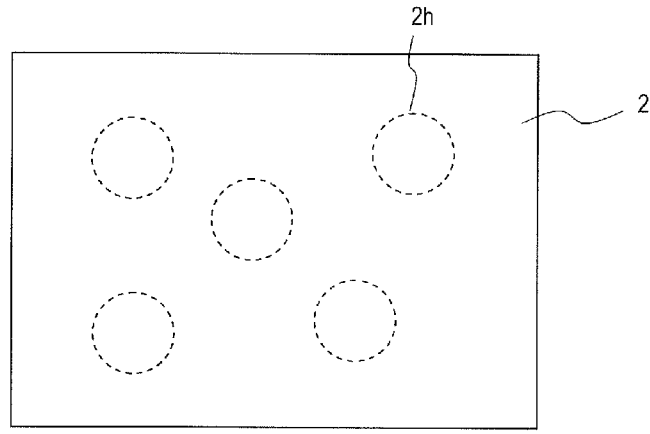
FIG. 1B is a plan view showing the position of a fourth area in the first embodiment.

FIG. 1B is a plan view of the light-trapping sheet 51, showing the arrangement of the fourth areas 2h. Preferably, a plurality of fourth areas 2h are provided in the light-transmitting sheet 2 as shown in FIG. 1B. Since the fourth area 2h extends from the first area 2a to the second area 2b, or in the opposite direction, at an angle larger than the critical angle, only out-of-critical-angle light, of the light propagating through the first area 2a and the second area 2b of the light-transmitting sheet 2, can pass from the first area 2a to the second area 2b, or in the opposite direction, passing through the fourth area 2h. Therefore, it is possible to prevent the deviation of the light distribution in the light-trapping sheet 51.

As shown in FIG. 2A, the in-critical-angle light 5a passes through the surface 3q of the second light-transmitting layer 3b, and a portion thereof is converted by the function of the diffraction grating 3d to guided light 5B that propagates inside the third light-transmitting layer 3c. The remainder primarily becomes the in-critical-angle light 5a' to pass through the light-coupling structure 3 as transmitted light or diffracted light, or becomes in-critical-angle light 5r to pass through the light-coupling structure 3 as reflected light. Upon entering the second light-transmitting layer 3b, there is also the out-of-critical-angle light 6b which is reflected by the surface 3q, but most of the light can be allowed to pass therethrough if anti-reflective nanostructures are formed on the surfaces 3q and 3p.

The coupling to the guided light 5B is the same as the principle of the conventional grating coupling method. Before the guided light 5B reaches an end face 3S of the third light-transmitting layer 3c, a portion thereof is radiated in the same direction as the in-critical-angle light 5r to be in-critical-angle light 5r', and the remainder is guided to be radiated from the end face 3S of the third light-transmitting layer 3c to be the out-of-critical-angle light 5c. On the other hand, the out-of-critical-angle light 6a is totally reflected at the surface 3q of the second light-transmitting layer 3b, and it entirely becomes the out-of-critical-angle light 6b. Thus, out-of-critical-angle light incident on the surface of the light-coupling structure (the surface 3p of the first light-transmitting layer 3a and the surface 3q of the second light-transmitting layer 3b) is reflected, as it is, as out-of-critical-angle light, while a portion of in-critical-angle light is converted to out-of-critical-angle light.

Note that if the length of the diffraction grating 3d of the third light-transmitting layer 3c is too long, the guided light 5B is entirely radiated before reaching the end face 3S. If it is too short, the efficiency of coupling to the guided light 5B is insufficient. How easily the guided light 5B is radiated is represented by the radiation loss coefficient $\alpha$, and the intensity of the guided light 5B is multiplied by a factor of $\exp(-2\alpha L)$ at a propagation distance of L. Assuming that the value of $\alpha$ is 10 (1/mm), the light intensity will be multiplied by a factor of 0.8 after propagation over 10 μm. The radiation loss coefficient $\alpha$ is related to the depth d of the diffraction grating 3d, and it monotonously increases in the range of $d \leq d_c$ while being saturated in the range of $d > d_c$. Where the wavelength of light is $\lambda$, the equivalent refractive index of the guided light 5B is $n_{eff}$, the refractive index of the light-transmitting layer 3c is $n_1$, and the duty of the diffraction grating 3d (the ratio of the width of the protruding portion with respect to the pitch) is 0.5, $d_c$ is give by Expression 2 below.

[Exp. 2]

$$d_c \approx \frac{\lambda}{2\pi}\sqrt{n_{eff}^2 - \left(\frac{n_1-1}{2}\right)^2} \quad (2)$$

For example, $d_c$–0.107 µm if λ=0.55 µm, $n_{eff}$=1.25, and $n_1$=1.5. In the monotonous increase region, the radiation loss coefficient α is in proportion to d squared. Therefore, the length of the diffraction grating 3d, i.e., the length of the third light-transmitting layer 3c (the dimensions W and L) is determined by the radiation loss coefficient α, and is dependent on the depth d of the diffraction grating 3d. Assuming that by adjusting the depth d, the value of α is set in the range of 2 to 100 (1/mm) and the attenuation ratio to 0.5, W and L will be about 3 µm to 170 µm. Therefore, if W and L are 3 µm or more and 100 µm or less, as described above, it is possible to suppress the radiation loss to obtain a high coupling efficiency by adjusting the depth d.

Table 1 shows the visible light wavelength (λ=0.4 to 0.7 µm) of light that is coupled for the pitch Λ and the angle of incidence θ based on Expression 1, where the equivalent refractive index $n_{eff}$ of the guided light 5B is set to 1.25. Each section of a dotted line is the range for coupling. For example, where the pitch is 0.4 µm, light having a wavelength of 0.4 µm is coupled at θ=–14° and light having a wavelength of 0.7 µm is coupled at θ=30°, thereby giving a visible light coupling range from θ=–14° to θ=30°.

TABLE 1

| | Angle of incidence θ (degrees) | | | | | | | |
|---|---|---|---|---|---|---|---|---|
| | –90 | –54 | –33 | –14 | 0 | 5 | 30 | 49 | 90 |
| Pitch Λ (µm) 0.18 | | | | | | | | | 0.4 |
| 0.20 | | | | | | | | 0.4-----0.5 | |
| 0.30 | | | | | | | 0.4--------------------0.7 | | |
| 0.40 | | | | 0.4------------------0.7 | | | | | |
| 0.56 | | | 0.4-------------0.7 | | | | | | |
| 1.60 | 0.4------0.7 | | | | | | | | |
| 2.80 | 0.7 | | | | | | | | |

The polarity of the angle of incidence θ is relevant to the light coupling direction. Therefore, if one focuses only on the presence/absence of coupling while ignoring the light coupling direction, covering either the range of angles of incidence from 0 to 90° or from –90 to 0° means that coupling is achieved for every angle of incidence. Therefore, it can be seen from Table 1 that in order for light to be coupled for every visible light wavelength and for every angle of incidence, one may combine together light-coupling structures 3 including diffraction gratings 3d having pitches Λ from 0.18 µm to 0.56 µm (from 0° to 90°), or from 0.30 µm to 2.80 µm (from –90° to 0°). Taking into consideration changes in the equivalent refractive index and manufacturing errors occurring when forming the waveguide layer and the diffraction grating, the pitch of the diffraction grating 3d may be generally 0.1 µm or more and 3 µm or less.

For example, as shown in FIG. 2B, the pitch of the diffraction grating 3d is Λ for the in-critical-angle light 5a that is incident in the direction perpendicular to the direction in which the diffraction grating 3d extends, but the effective pitch of the diffraction grating 3d for light 5aa that is incident at an azimuthal angle of φ is Λ/cos φ. For example, where the azimuthal angle φ of incidence of the light 5aa is 0 to 87°, the effective pitch is Λ to 19Λ. Therefore, where Λ=0.18 µm is set, it is possible to realize effective pitches Λ from 0.18 to 2.80 µm depending on the azimuth of incident light even with the same diffraction grating 3d, and where Λ=0.30 µm is set, it is possible to realize pitches Λ from 0.30 to 2.80 µm. Therefore, it is possible to take in light for every visible light wavelength and for every angle of incidence also by placing light-coupling structures 3 of a single pitch in the light-transmitting sheet 2 while turning the light-coupling structures 3 so that the direction in which the diffraction grating extends (the azimuth of the diffraction grating) varies from 0° to 180°, other than by combining together light-coupling structures 3 including diffraction gratings 3d having different pitches. Moreover, for a plurality of light-coupling structures 3, the pitch of the diffraction grating 3d and the direction in which the diffraction grating 3d extends may both be varied.

Next, light at end faces 3r and 3s perpendicular to the surfaces 3p and 3q of the light-coupling structure 3 (surfaces extending along the normal direction to the light-transmitting layer 3b) will be discussed. As shown in FIG. 2C, possible courses of action for the light incident on the end face 3r of the light-coupling structure 3 are: to be reflected by the end face 3r; to be diffracted through the end face 3r; to be refracted passing through the end face 3r; and to be guided through the third light-transmitting layer 3c passing through the end face 3r. For example, the out-of-critical-angle light 6a which is incident on, and passes through, the end faces of the first light-transmitting layer 3a and the second light-transmitting layer 3b is refracted to be in-critical-angle light 6a'. A portion of light 6A which is incident on, and passes through, the end face of the third light-transmitting layer 3c is converted to guided light 6B which propagates inside the third light-transmitting layer 3c.

Figure 2D:
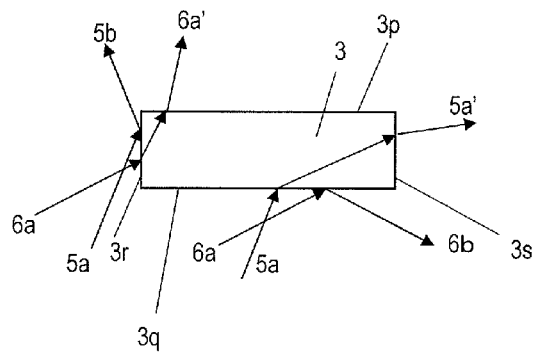
FIG. 2D is a cross-sectional view showing light being incident on the light-coupling structure with a light-transmitting layer 3c removed.
Figure 2E:
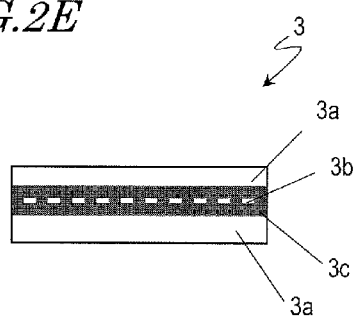
FIG. 2E is a cross-sectional view showing another configuration example of a light-coupling structure.

For reference, FIG. 2D shows the optical path obtained when the third light-transmitting layer 3c is removed from the light-coupling structure 3 and the space left by the removal is filled with the same air as the first light-transmitting layer 3a and the second light-transmitting layer 3b. When the in-critical-angle light 5a is incident on the surface 3q of the light-coupling structure 3, if the position of incidence is close to the end face 3s, it is output through the end face 3s as the out-of-critical-angle light 5a' as a result of refraction. When the in-critical-angle light 5a is incident on the end face 3r of the light-coupling structure 3, it is totally reflected by the end face 3r. When the out-of-critical-angle light 6a is incident on the end face 3r of the light-coupling structure 3, it is output from the surface 3p as the in-critical-angle light 6a' as a result of refraction, irrespective of the position of incidence. When the out-of-critical-angle light 6a is incident on the surface 3q of the light-coupling structure 3, it is totally reflected by the surface 3q.

Thus, for light that is incident on the end faces 3r and 3s of the light-coupling structure 3, the behavior is complicated, and even if out-of-critical-angle light is incident on the end face, it is not always output as out-of-critical-angle light. However, if the size of the surface (W, L) is set to be sufficiently (e.g., 4 times or more) larger than the size of the end face (a+t+d+b), the influence at the end face will be sufficiently small, and then the transmission or the reflection of light at the surfaces 3p and 3q can be seen as the transmission or reflection behavior of light for the entire light-coupling structure 3. Specifically, if the size of the surface 3p of the first light-transmitting layer 3a and the surface 3q of the second light-transmitting layer 3b is 4 times or more of the thickness of the light-coupling structure 3, it is possible to sufficiently ignore the influence of light at the end faces 3r and 3s of the light-coupling structure 3. Therefore, the light-coupling structures 3 exhibit a function of irreversibly converting in-critical-angle light to out-of-critical-angle light while maintaining out-of-critical-angle light as out-of-critical-angle light, and if the density of the light-coupling structures 3 is set to a sufficient density, it is possible to convert all the light incident on the light-trapping sheet 51 to out-of-critical-angle light (i.e., light confined within the sheet).

Figure 3:
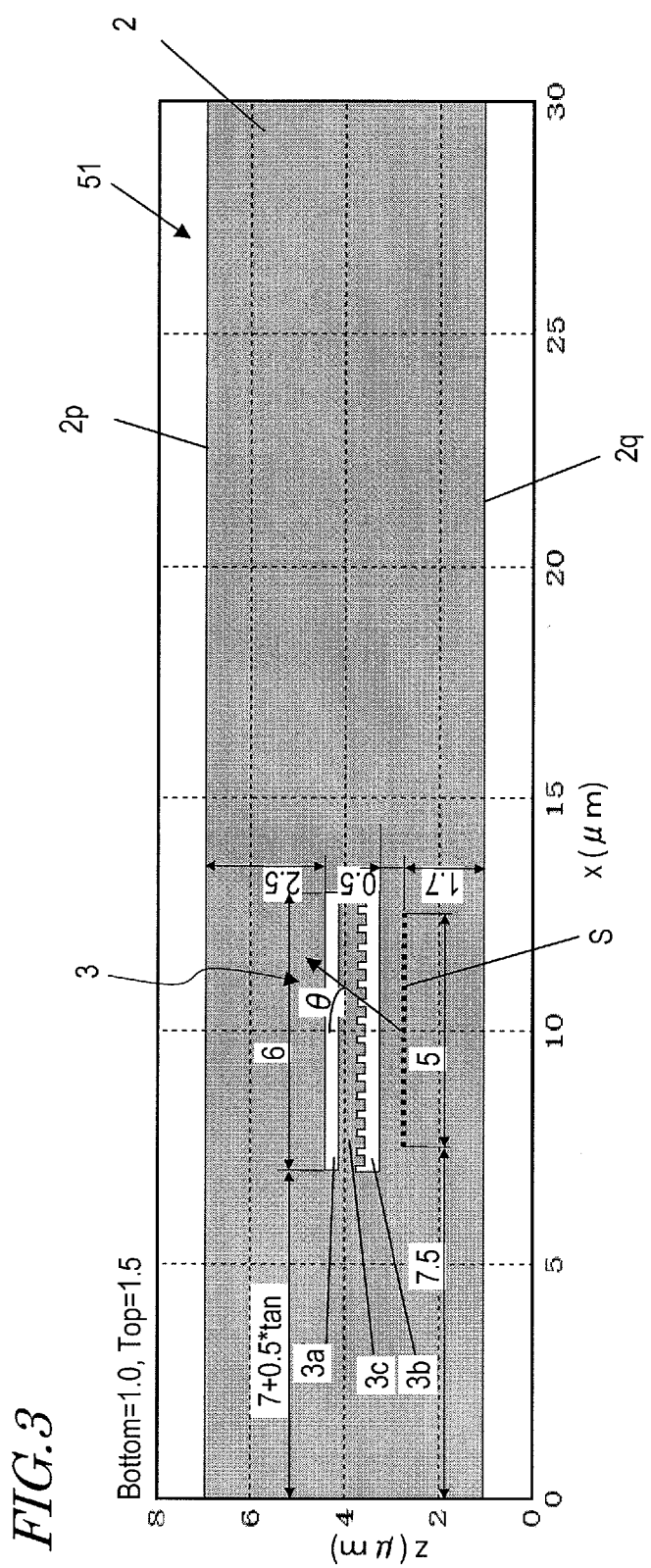
FIG. 3 is a cross-sectional view showing a structure used in analyzing the light-trapping sheet of the first embodiment.

FIG. 3 shows a cross-sectional structure of a light-trapping sheet used in an analysis for confirming the light-confining effect of the light-trapping sheet 51. A light-trapping sheet including one light-coupling structure was used for the analysis. As shown in FIG. 3, a light source S (indicated by a broken line) having a width of 5 μm was set in parallel at a position of 1.7 μm from the second principal surface 2q of the light-transmitting sheet 2, and the second light-transmitting layer 3b having a width of 6 μm was arranged in parallel thereabove at a distance of 0.5 μm, with the third light-transmitting layer 3c and the first light-transmitting layer 3a of the same width being arranged thereabove. The first principal surface 2p of the light-transmitting sheet 2 is located at a position of 2.5 μm from the surface of the first light-transmitting layer 3a. The positions of the first light-transmitting layer 3a, the second light-transmitting layer 3b and the third light-transmitting layer 3c are shifted side to side based on the angle θ so that a plane wave having a polarization at an angle of 45° with respect to the drawing sheet is output from the light source S at an azimuth forming the angle of θ with respect to the normal to the second principal surface 2q, and the center of the incident light passes through the center of the surface of the second light-transmitting layer 3b. The thickness a of the first light-transmitting layer 3a was set to 0.3 μm, the thickness c of the second light-transmitting layer 3b to 0.3 μm, the thickness t of the third light-transmitting layer 3c to 0.4 μm, the depth d of the diffraction grating to 0.18 μm, and the pitch Λ of the diffraction grating to 0.36 μm. The refractive index of the light-transmitting sheet 2 and the third light-transmitting layer 3c was assumed to be 1.5, and the refractive index of the environmental medium, the first light-transmitting layer 3a and the second light-transmitting layer 3b to be 1.0.

Figure 4B:
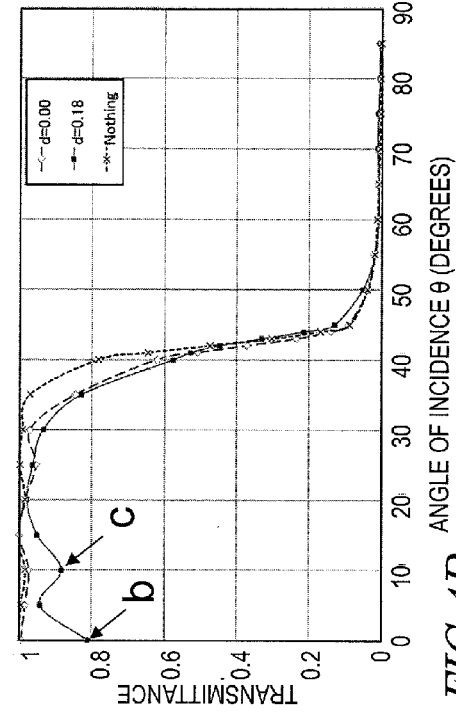
Figure 4D:
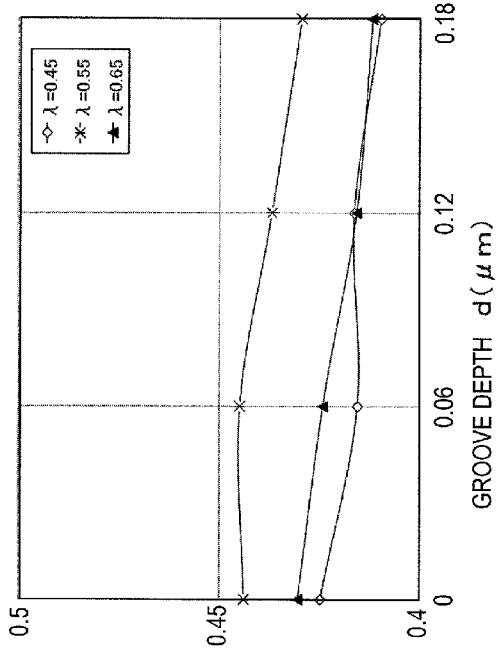
Figure 4A:
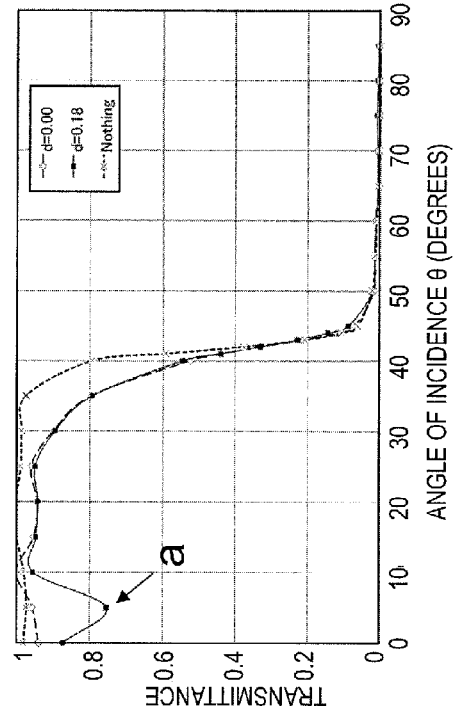
Figure 4C:
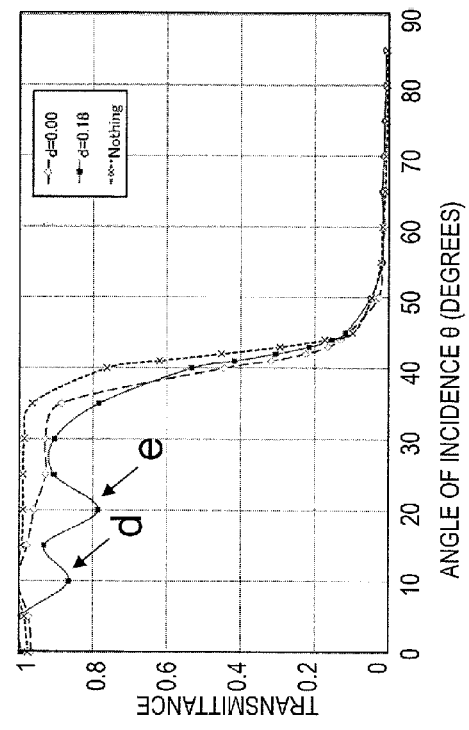

FIGS. 4A to 4C are results of an analysis using a light-trapping sheet having the structure shown in FIG. 3, each showing the relationship between the angle of incidence θ of light from the light source S incident on the light-coupling structure 3 and the transmittance of light that is output to the outside of the light-trapping sheet. The structure used in the analysis was as described above. A two-dimensional finite-difference time-domain method (FDTD) was used in the analysis. Therefore, the analysis results are those with a structure in which the cross section shown in FIG. 3 extends infinitely in the direction perpendicular to the drawings sheet. The transmittance was measured while it was stable, and was defined by the ratio of the integrated value of the Poynting vectors passing through the bottom surface (z=0 μm) and the top surface (z≈8 μm) of the analysis area with respect to the integrated value of the Poynting vectors passing through a closed curved surface surrounding the light source. While there are some calculation results exceeding 100%, it is because of slight errors in the measurement of the Poynting vectors of the light source.

FIG. 4A shows the calculation results for a case where the wavelength λ of the light source is 0.45 μm, FIG. 4B for a case where the wavelength λ is 0.55 μm, and FIG. 4C for a case where the wavelength λ is 0.65 μm. Each figure uses the depth d of the diffraction grating as a parameter, and is also plotting the results obtained under a condition where there is no light-coupling structure 3 (a configuration only with the light-transmitting sheet 2 and the light source S).

A comparison between the results obtained in a case where the light-coupling structures 3 are present but the depth d of the diffraction grating is d=0 and the results (Nothing) obtained in a case where there is no light-coupling structure shows that the former has a lower transmittance than the latter in a range within the critical angle (41.8°), and they are both substantially zero for angles greater than or equal to that. The reason why the former has a lower transmittance within the critical angle is because light incident on the surface 3q of the second light-transmitting layer 3b is refracted and a portion thereof is output from the end face 3s as out-of-critical-angle light, as described above with reference to FIG. 2D. Note however that for the former, out-of-critical-angle light entering through the end face 3r of the light-coupling structure 3 is refracted through this surface, and is then refracted through the surface 3p of the first light-transmitting layer 3a to be in-critical-angle light inside the light-transmitting sheet 2, as described above again with reference to FIGS. 2C and 2D. Therefore, for a structure where d=0, there is conversion to out-of-critical-angle light while there is also conversion to in-critical-angle light, and it can be said that the light-confining effect as a whole is small.

On the other hand, a comparison between the results for a case where the depth of the grating is d=0.18 μm and the results for a case where d=0 shows that although the transmittance of the former is substantially close to that of the latter, the transmittance drops at positions indicated by arrows a, b, c, d and e. FIG. 4D shows the standard value (a value obtained by division by 90) of a value obtained by integrating each of the curves of FIGS. 4A, 4B and 4C for the angle of incidence θ, using the depth d of the diffraction grating as a parameter. Since the analysis model is two-dimensional, the integrated value is equal to the efficiency with which light in the light-confining sheet is taken out of the sheet. With any wavelength, the take-out efficiency decreases as d increases (at least for the comparison between d=0 and d=0.18). This represents the light-confining effect by a single light-coupling structure. This effect can be accumulated, and by increasing the number of light-coupling structures, it is possible to eventually confine all the light. Note that while this analysis is a two-dimensional model, there is always incident light that satisfies Expression 1, which is the coupling condition, for an arbitrary azimuthal angle φ shown in the plan view of FIG. 2A in an actual model (three-dimensional model), and therefore the transmittance curves shown in FIGS. 4A to 4D will drop for the entire range of the angle of incidence θ, rather than for the local range such as the arrows a, b, c, d and e, thus increasing the light-confining effect of the light-coupling structures.

FIGS. 5A to 5E shows light intensity distribution diagrams in the light-trapping sheet under conditions indicated by arrows a, b, c, d and e of FIGS. 4A to 4D. Specifically, FIG. 5A shows the results where the wavelength is Λ=0.45 μm and θ=5°, FIG. 5B shows the results where the wavelength is Λ=0.55 μm and θ=0°, FIG. 5C shows the results where the wavelength is Λ=0.55 μm and θ=10°, FIG. 5D shows the results where the wavelength is Λ=0.65 μm and θ=10°, and FIG. 5E shows the results where the wavelength is Λ=0.65 μm and θ=20°.

For the conditions and the angles of incidence shown in FIGS. 5A and 5B, since the refractive index of the third light-transmitting layer 3c is higher than the refractive index of the first light-transmitting layer 3a and the second light-transmitting layer 3b surrounding the third light-transmitting layer 3c, the third light-transmitting layer 3c functions as a waveguide layer, and the incident light is coupled to the guided light propagating inside the third light-transmitting layer 3c by the function of the diffraction grating, with the light being radiated into the light-transmitting sheet 2 from the end faces 3r and 3s of the third light-transmitting layer 3c. The radiated light is out-of-critical-angle light, and is totally reflected by the first principal surface 2p and the second principal surface 2q of the light-transmitting sheet 2 to be confined within the light-transmitting sheet 2. Also for the conditions and the angles of incidence shown in FIGS. 5C, 5D and 5E, the incident light is coupled to the guided light propagating inside the third light-transmitting layer 3c by the function of the diffraction grating, with the light being radiated into the sheet from the end face 3r of the third light-transmitting layer 3c. The radiated light is out-of-critical-angle light, and is totally reflected by the first principal surface 2p and the second principal surface 2q of the light-transmitting sheet 2 to be confined within the light-transmitting sheet 2. Note that in FIGS. 5A, 5C and 5E, the radiated light is divided into two, and the coupled light is guided light of the first-order mode whose phase is reversed above and below the cross section of the waveguide layer. On the other hand, in FIGS. 5B and 5D, the radiated light is in an undivided state, and the coupled light is guided light of the zeroth-order mode.

Figure 6A:
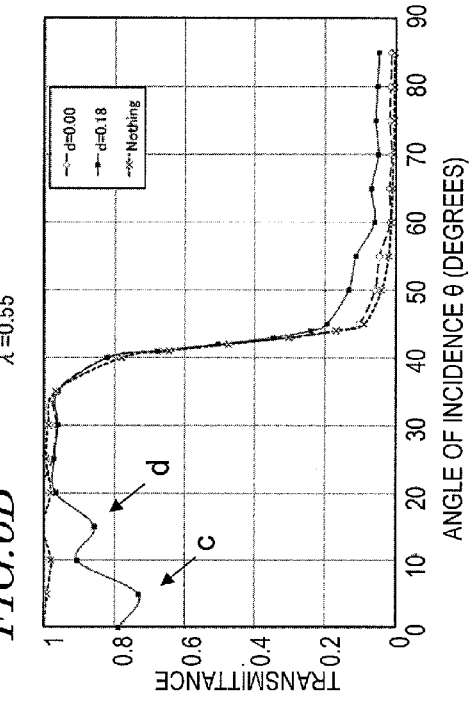
Figure 6B:
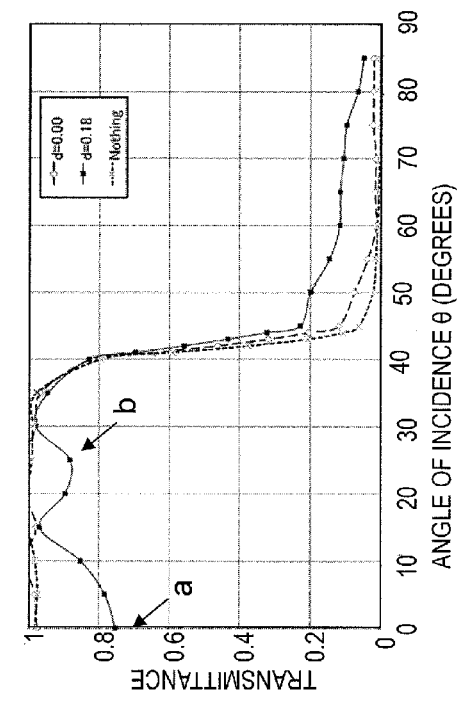
Figure 6C:
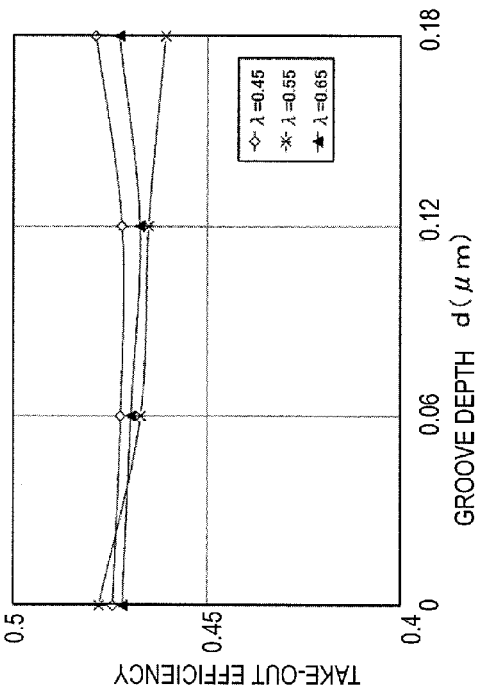
Figure 6D:
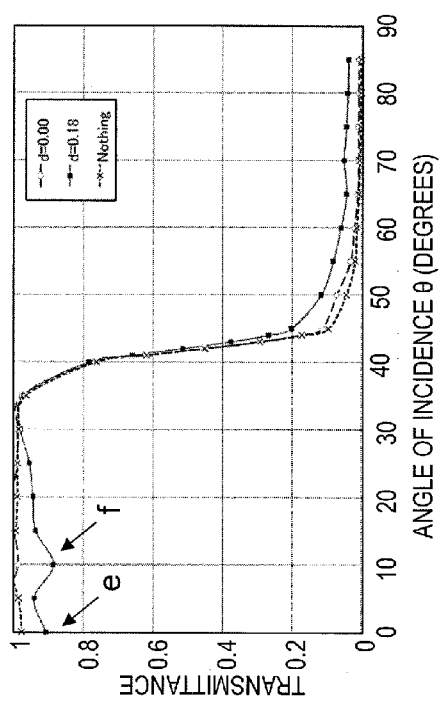

FIGS. 6 to 6D show results of an analysis using the structure shown in FIG. 3 where the refractive index of the first light-transmitting layer 3a and the second light-transmitting layer 3b is made to coincide with the refractive index of the light-transmitting sheet 2, and the refractive index of the third light-transmitting layer 3c is changed to 2.0. The other conditions are the same as those when the analysis results shown in FIGS. 4A to 4D were obtained. FIG. 6A shows the results where the wavelength of the light source is $\Lambda=0.45$ μm, FIG. 6B shows the results where the wavelength is $\Lambda=0.55$ μm, and FIG. 6C shows the results where the wavelength is $\Lambda=0.65$ μm. A comparison between the results where the depth of the grating is d=0.18 μm and the results where d=0 shows that the transmittance of the former drops at positions of arrows a, b, c, d, e and f, as compared with that of the latter. This is for the same reason as described above with reference to FIGS. 4 to 4D. However, in the region above the critical angle, the latter comes to the vicinity of zero whereas the former is substantially floating. This is because light of an angle of incidence above the critical angle diffracts through the diffraction grating of the light-coupling structure 3, and a portion thereof is converted to in-critical-angle light in the sheet. FIG. 6D shows the standard value (a value obtained by division by 90) of a value obtained by integrating each of the curves of FIGS. 6A, 6B and 6C for the angle of incidence θ, using the groove depth d as a parameter. For some conditions, an increase in d rather increased the take-out efficiency, thereby failing to obtain the light-confining effect. This indicates that the characteristics in the region above the critical angle cancel out the effects at the positions of the arrows a, b, c, d, e and f.

A comparison between analysis results of FIGS. 4 and 6 shows that the transmittance is successfully made zero above the critical angle in FIGS. 4A to 4D. A comparison between the results where the depth of the grating is d=0.18 μm and the results where d=0 shows there is no difference in the region above the critical angle, and they are both substantially zero. This is because the refractive index of the first light-transmitting layer 3a and the second light-transmitting layer 3b is set to be smaller than the refractive index of the light-transmitting sheet 2, resulting in total reflection at the surface 3q which is the interface between the second light-transmitting layer 3b and the light-transmitting sheet 2, whereby light of a large angle of incidence cannot enter the diffraction grating in the light-coupling structure 3, and there is no diffracted light caused by the diffraction grating. Thus, it can be seen that with the light-coupling structure 3, in order for the third light-transmitting layer 3c to be a light guide layer, the refractive index thereof may be larger than the refractive index of the first light-transmitting layer 3a and the second light-transmitting layer 3b, and in order for out-of-critical-angle light not to enter the third light-transmitting layer 3c, the refractive index of the first light-transmitting layer 3a and the second light-transmitting layer 3b may be smaller than the refractive index of the light-transmitting sheet 2. It can also be seen that in order to decrease the critical angle for the total reflection between the light-transmitting sheet 2 and the light-coupling structure, the difference between the refractive index of the first light-transmitting layer 3a and the second light-transmitting layer 3b and the refractive index of the light-transmitting sheet is preferably large, and the refractive index of the first light-transmitting layer 3a and the second light-transmitting layer 3b may be 1, for example.

Thus, with the light-trapping sheet of the present embodiment, light incident on the first principal surface and the second principal surface of the light-transmitting sheet at various angles becomes in-critical-angle light and enters a light-coupling structure arranged inside the light-transmitting sheet, and a portion thereof is converted by the diffraction grating in the light-coupling structure to guided light that propagates inside the third light-transmitting layer and is radiated from the end face of the light-coupling structure to be out-of-critical-angle light. Because the pitch of the diffraction grating varies and the azimuth of the diffraction grating varies from one light-coupling structure to another, this conversion is achieved for every azimuth over a wide wavelength range, e.g., over the entire visible light range. Since the length of the diffraction grating is short, it is possible to reduce the radiation loss of the guided light. Therefore, in-critical-angle light present inside the light-transmitting sheet is all converted to out-of-critical-angle light by a plurality of light-coupling structures. Since the refractive index of the first and second transmission layers of the light-coupling structure is smaller than the refractive index of the light-transmitting sheet, the out-of-critical-angle light is totally reflected by the surface of the light-coupling structure, and the light is repeatedly totally reflected between the surfaces of other light-coupling structures and the surface of the light-transmitting sheet, thus being confined within the light-transmitting sheet. Thus, the light-coupling structure irreversibly converts in-critical-angle light to out-of-critical-angle light, while maintaining out-of-critical-angle light in the out-of-critical-angle state. Therefore, if the density of the light-coupling structures is set to a sufficient density, it is possible to convert all the light incident on the light-trapping sheet to out-of-critical-angle light, i.e., light confined within the sheet. If the confining effect is small with a single light-transmitting sheet, it is possible to easily achieve a predetermined level of effect by layering together a plurality of light-transmitting sheets.

Note that in FIG. 1A, the first principal surface 2p of the light-transmitting sheet 2 located at the outermost surface is covered by the cover sheet 2e via the buffer layer 2f therebetween. Therefore, a foreign matter 2g such as a drop of water remains on the surface of the cover sheet 2e, and is prevented from coming into contact with the first principal surface 2p. If the foreign matter 2g comes into contact with the first principal surface 2p, the total reflection relationship at the contact surface is lost, whereby the out-of-critical-angle light, which has been confined within the light-transmitting sheet 2, leaks to the outside via the foreign matter 2g. Although the spacer 2d is also in contact with the first principal surface 2p, the refractive index thereof is substantially the same as the refractive index of the environmental medium, the total reflection relationship at the contact surface is maintained, and the out-of-critical-angle light will not leak to the outside via the spacer 2d. If the surface area of the light-transmitting sheet is small, one may employ a configuration where the buffer layer 2f is formed between the cover sheet 2e and the first principal surface 2p, instead of providing the spacer 2d sandwiched therebetween.

Figure 28A:
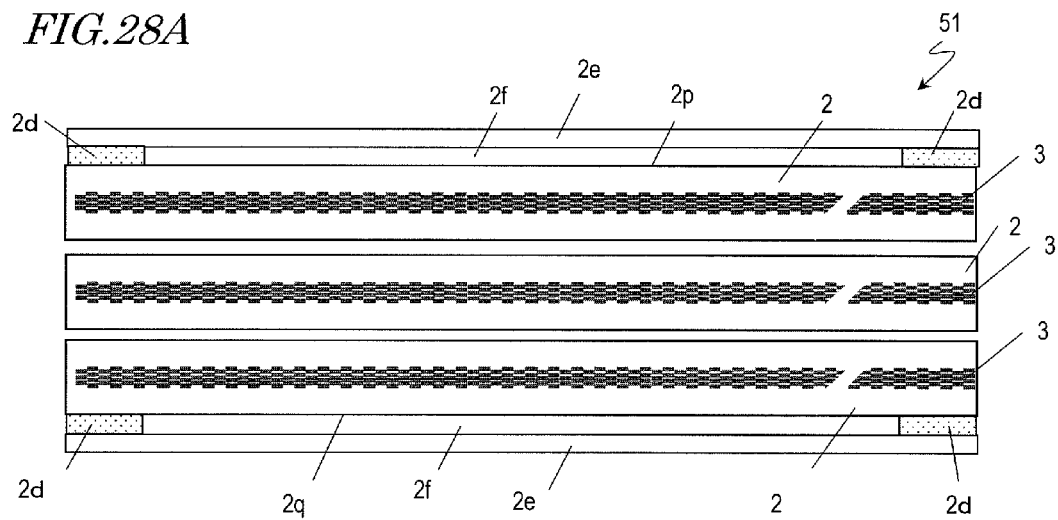
FIGS. 28A and 28B are schematic cross-sectional views showing still other embodiments of the light-trapping sheet according to the present disclosure.
Figure 28B:
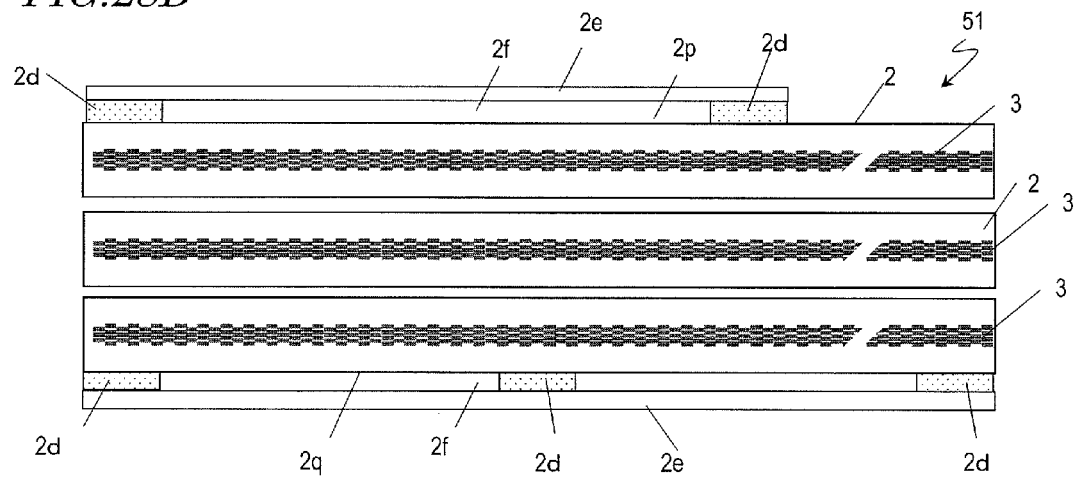

FIGS. 28A and 28B are cross-sectional views each showing an example arrangement of cover sheets 2e. In the example of FIG. 28A, cover sheets 2e are provided so as to oppose the first principal surface 2p of the light-transmitting sheet 2 located at the top surface and the second principal surface 2q of the light-transmitting sheet 2 located at the bottom surface both with a "gap" interposed therebetween. In this example, the first principal surface 2p of the light-transmitting sheet 2 located at the top surface and the second principal surface 2q of the light-transmitting sheet 2 located at the bottom surface are both entirely covered by the cover sheets 2e. In the example of FIG. 28B, a portion of the first principal surface 2p of the light-transmitting sheet 2 located at the top surface is not opposing the cover sheet 2e. Also in this example, a spacer 2d is provided at a position other than the end portions of the second principal surface 2q of the light-transmitting sheet 2 located at the bottom surface. Note that the "gap" described above may be filled with a fluid or a solid whose refractive index is sufficiently small.

The light-trapping sheet 51 can be manufactured by the following method, for example. FIGS. 7A to 7E are schematic cross-sectional configuration views showing a manufacturing procedure of the light-trapping sheet 51, and FIGS. 8A and 8B are schematic plan views each showing a pattern of a mold surface for producing the sheet.

Figure 8A:
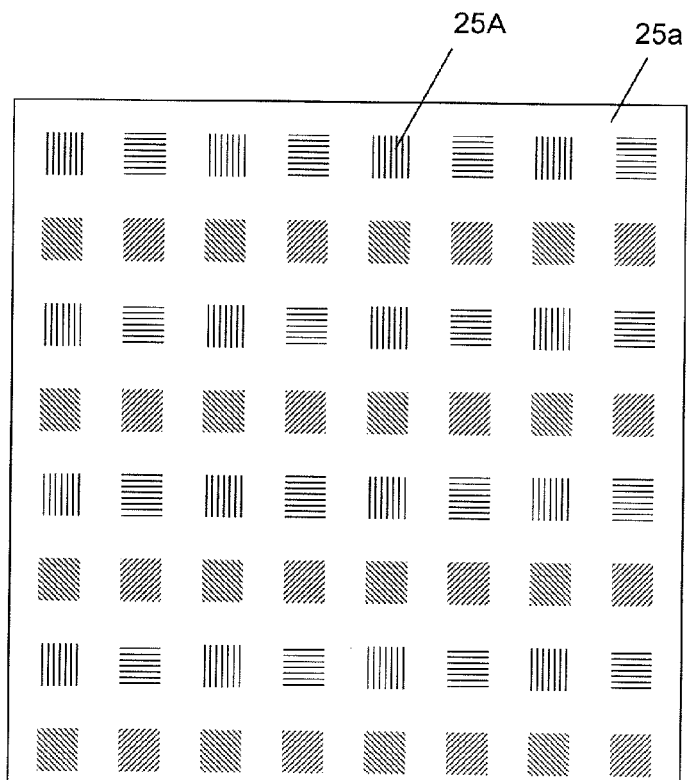
FIGS. 8A and 8B are schematic plan views each showing a surface pattern of a mold used in manufacturing the light-trapping sheet of the first embodiment.
Figure 8B:
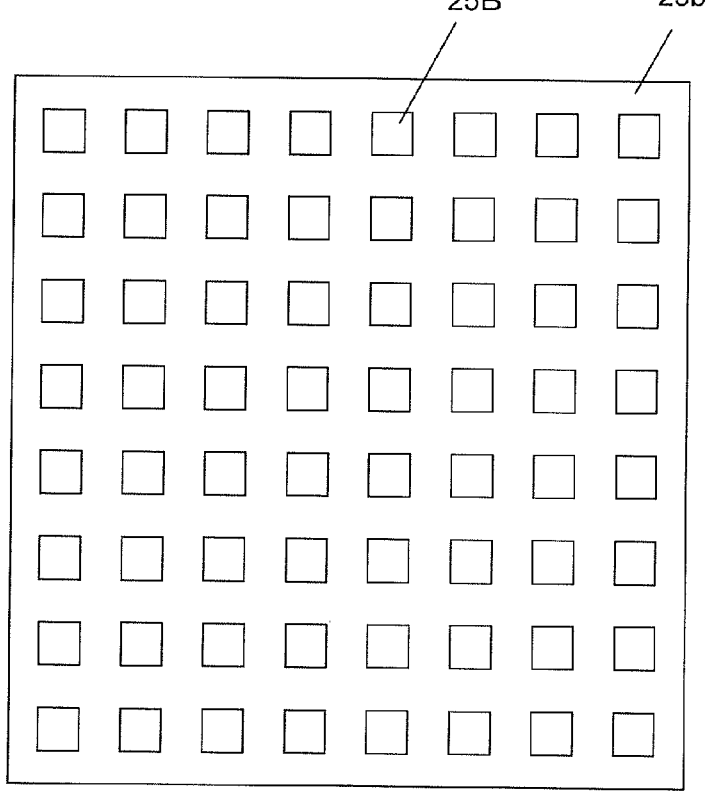

In FIGS. 8A and 8B, rectangular minute structures 25A and 25B of the same size are two-dimensionally arranged, for example, on the surfaces of molds 25a and 25b. The arrangement of the minute structures 25A on the mold 25a and the arrangement of the minute structures 25B on the mold 25b are equal. In the present embodiment, the minute structures 25A and 25B are protrusions. The height of the minute structures 25A is the dimension b of FIG. 2A, and the height of the minute structures 25B is equivalent to the dimension a. While the surface of the minute structure 25B is a plane, a linear diffraction grating having a height of d and a pitch of Λ is formed on the surface of the minute structure 25A, and the azimuth of the diffraction grating (the direction in which the depressed portion or the protruding portion extends) varies from one minute structure 25A to another. While gratings of azimuths of 45° intervals, i.e., 0°, 45°, 90° and 135°, are arranged regularly in FIGS. 8A and 8B, gratings may be arranged in practice with an equal frequency at azimuths of smaller intervals, e.g., 30° or 15°.

Figure 7A:
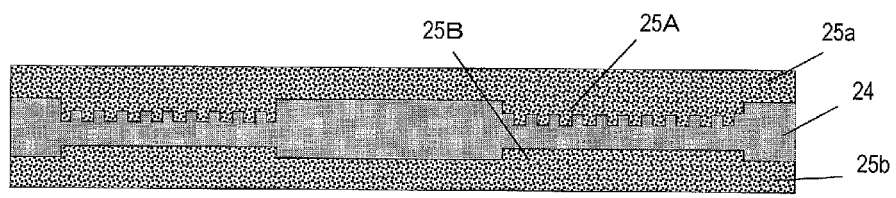
FIGS. 7A to 7E are schematic cross-sectional views showing a manufacturing procedure of the light-trapping sheet of the first embodiment.

As shown in FIG. 7A, with a thin layer of a spacer agent applied on the surface of the mold 25b, a transparent resin sheet 24 is laid on the surface of the mold 25b, and the mold 25a is arranged on the sheet, pressing the resin sheet 24 sandwiched between the mold 25b and the mold 25b while the minute structures 25B and the minute structures 25A are aligned with each other.

Figure 7B:
Figure 7C:
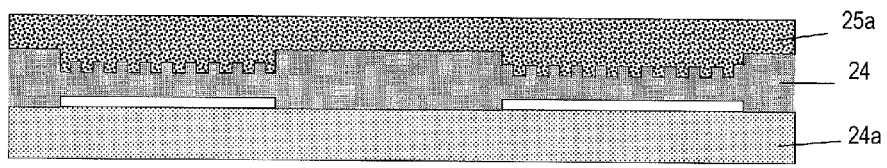
Figure 7D:
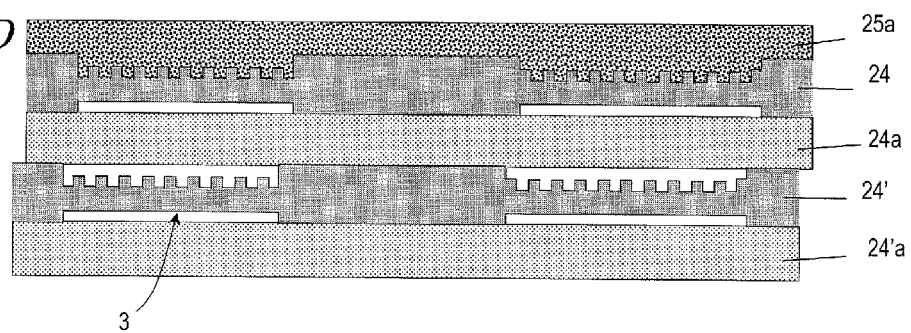

As shown in FIG. 7B, the mold 25a is lifted, thereby peeling the resin sheet 24 off the mold 25b, and the resin sheet 24 is pressed against a resin sheet 24a with a thin layer of an adhesive applied on the surface thereof as shown in FIG. 7C, thereby bonding together the resin sheet 24 and the resin sheet 24a. As shown in FIG. 7D, an adhesive is applied in a thin layer on the bottom surface of the resin sheet 24a, and it is pressed against similarly-formed resin sheets 24' and 24'a while ignoring the alignment therebetween, thus bonding them together.

Figure 7E:
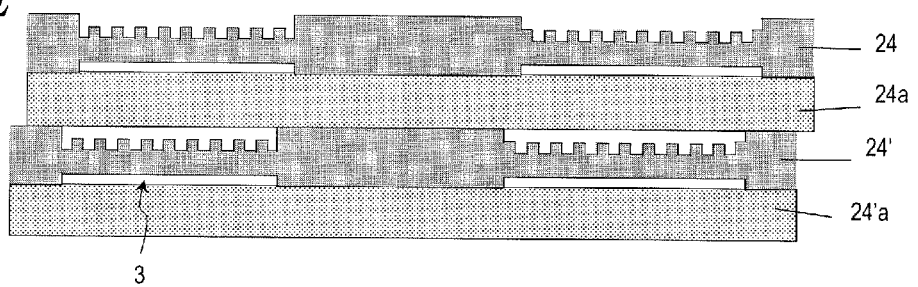

As shown in FIG. 7E, the mold 25a is lifted while the resin sheet 24'a is secured, thereby peeling the resin sheets 24, 24a, 24' and 24'a as a whole off the mold 25a.

Thereafter, the resin sheets 24, 24a, 24' and 24'a are replaced by the resin sheets 24' and 24'a of FIG. 7D, and these steps are repeated, thereby producing the third area 2c of the light-transmitting sheet 2 shown in FIG. 1A. Resin sheets to be the first area 2a and the second area 2b of the light-transmitting sheet 2 are bonded to the front surface and the reverse surface of the third area 2c of the light-transmitting sheet 2, thereby completing the light-trapping sheet 51 shown in FIG. 1A. While an adhesive is used for the bonding between resin sheets in the present embodiment, the surfaces of the resin sheets may be heated so as to weld together the resin sheets, instead of using an adhesive. Anti-reflective nanostructures may be formed in advance on the surface of the resin sheet 24a and the resin sheets to be the first area 2a and the second area 2b.

In embodiments hereinbelow, for the sake of simplicity, a plurality of light-transmitting sheets 2 layered together will not be described separately, but will be described collectively as if they were a single light-transmitting sheet 2.

(Second Embodiment)

A second embodiment of a light-trapping sheet according to the present disclosure will be described. A light-trapping sheet 52 of the present embodiment is different from the light-coupling structure of the first embodiment in terms of the structure at the end face of the light-coupling structure. Therefore, the description hereinbelow will focus on the light-coupling structure of the present embodiment.

Figure 9A:
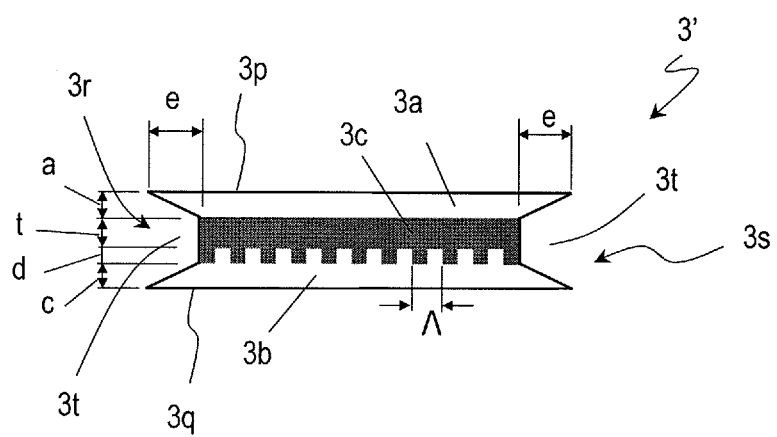
FIGS. 9A and 9B are a schematic cross-sectional view and a plan view showing a light-coupling structure used in a second embodiment of a light-trapping sheet according to the present disclosure.
Figure 9B:
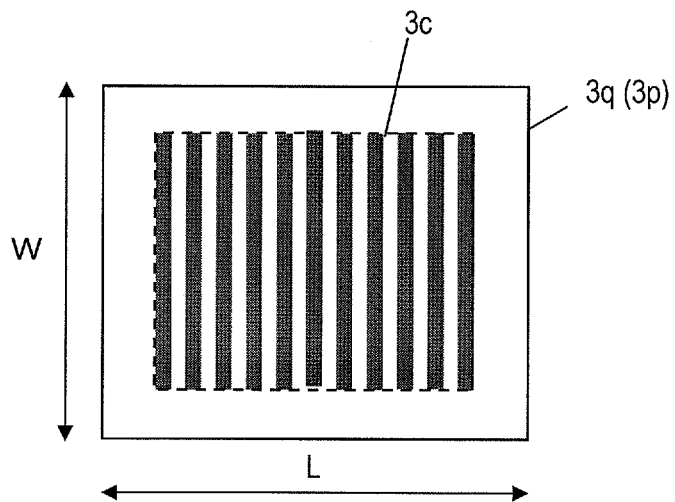

FIGS. 9A and 9B schematically show a cross-sectional structure and a planar structure of a light-coupling structure 3' along the thickness direction of the light-trapping sheet 52. As shown in FIGS. 9A and 9B, a depressed portion 3t having a depth of e is provided on the end faces 3r and 3s of the light-coupling structure 3'. The cross section of the depressed portion 3t has a width that is tapered inwardly. Therefore, in the light-coupling structure 3', the thickness of the first light-transmitting layer 3a and that of the second light-transmitting layer 3b decrease toward the outer edge side away from the center of the light-coupling structure 3'. The surfaces 3p and 3q are flat as they are in the first embodiment.

Figure 10:
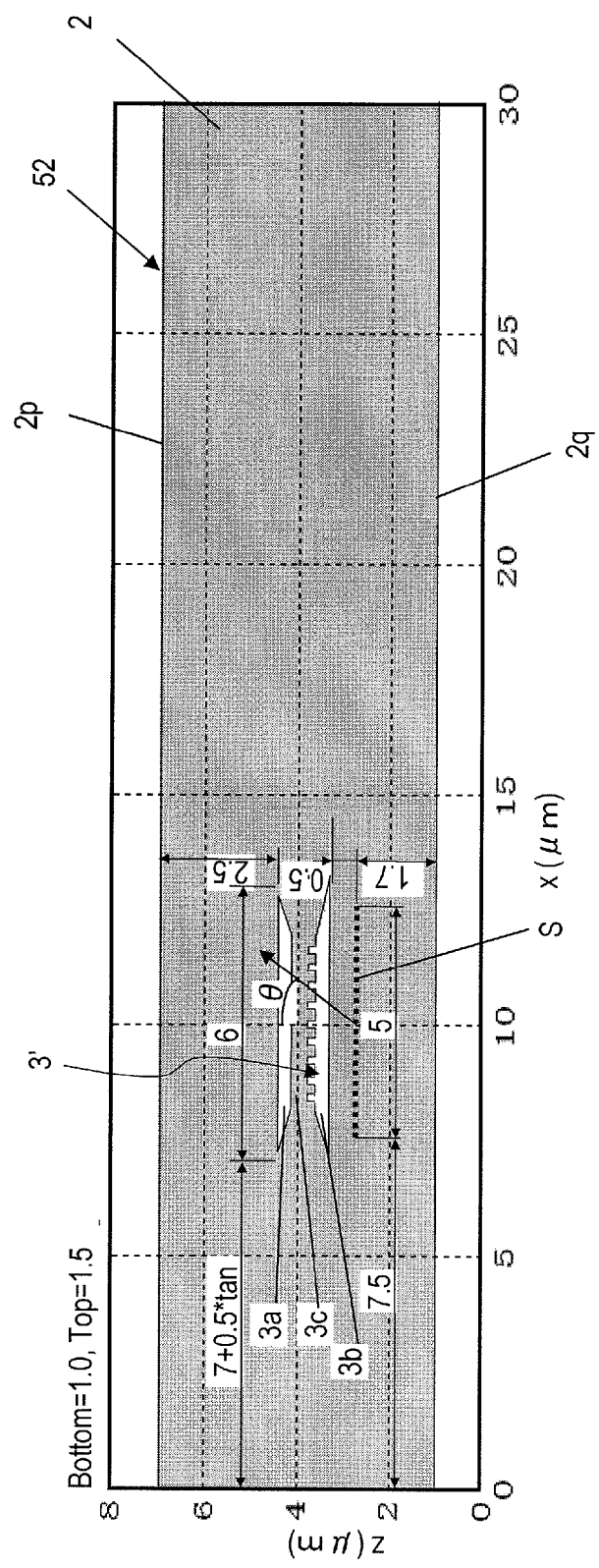
FIG. 10 is a cross-sectional view showing a structure used in analyzing the light-trapping sheet of the second embodiment.

FIG. 10 shows a cross-sectional structure of light-trapping sheet used in an analysis for confirming the light-confining effect of the light-trapping sheet 52 including the light-coupling structure 3'. The light-coupling structure and the light source are arranged at just the same positions as the corresponding elements in the structure used in the analysis in the first embodiment (FIG. 3).

Figure 11B:
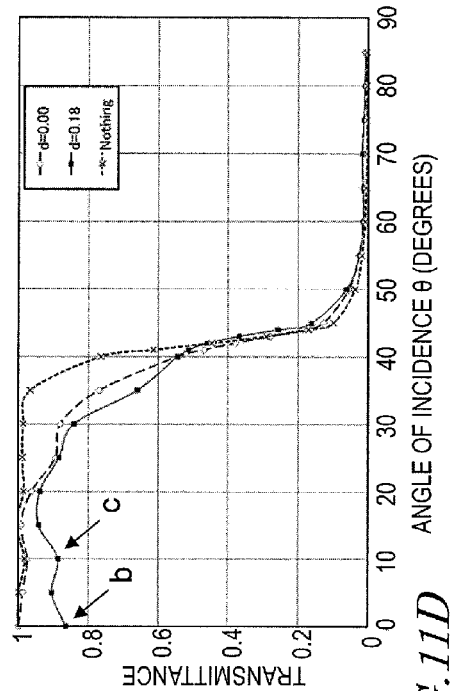
FIGS. 11A to 11D show results of an analysis conducted using the structure shown in FIG. 10, wherein FIG. 11A to FIG. 11C each show the relationship between the angle of incidence and the transmittance out of the sheet.
Figure 11D:
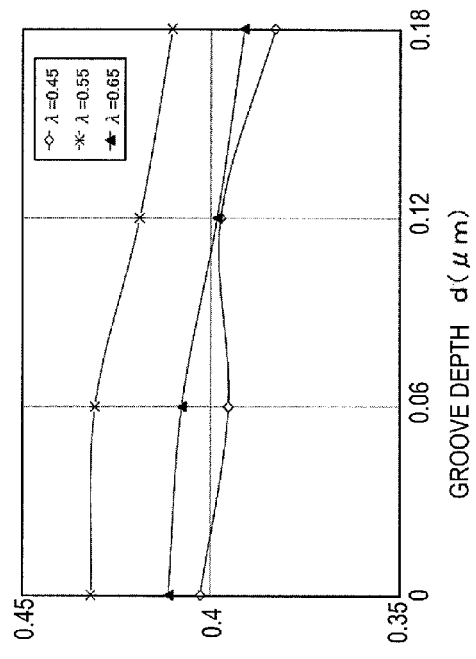
Figure 11A:
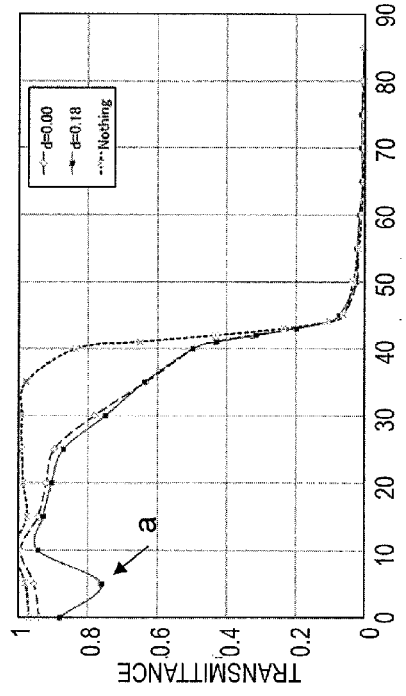
Figure 11C:
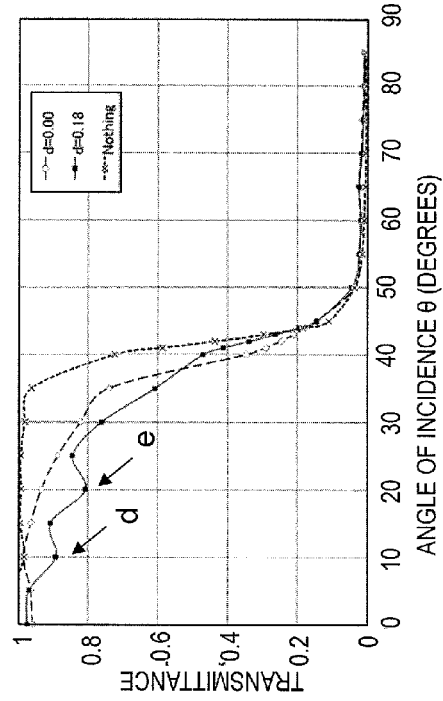
Figure 13A:
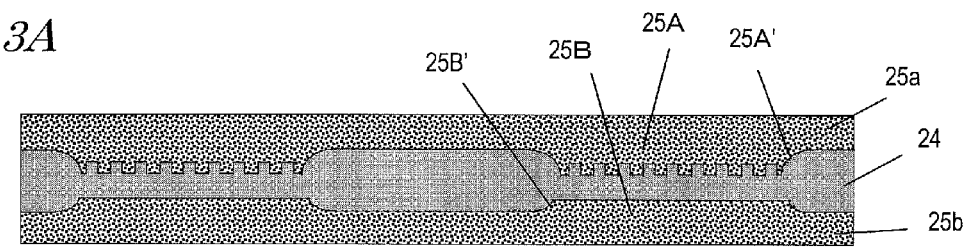
FIGS. 13A to 13E are schematic cross-sectional views showing a manufacturing procedure of the light-trapping sheet of the second embodiment.
Figure 13B:
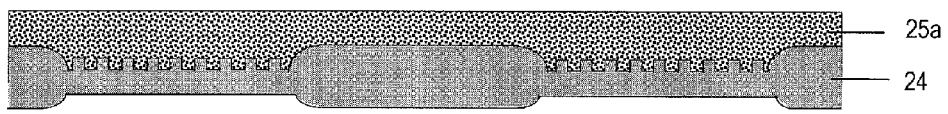
Figure 13C:
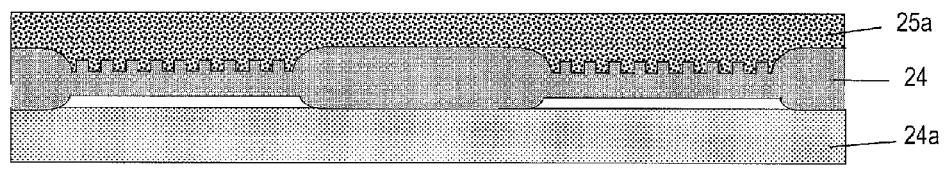
Figure 13D:
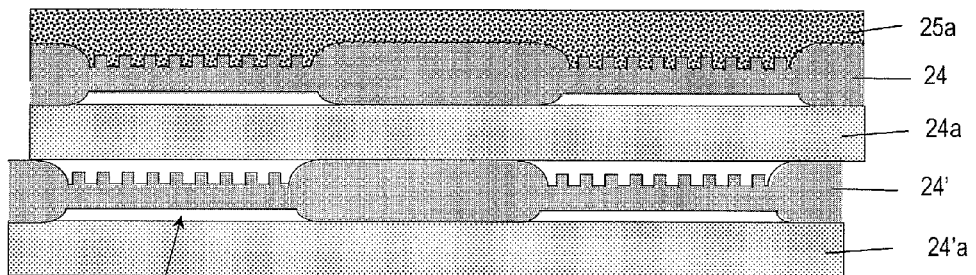
Figure 13E:
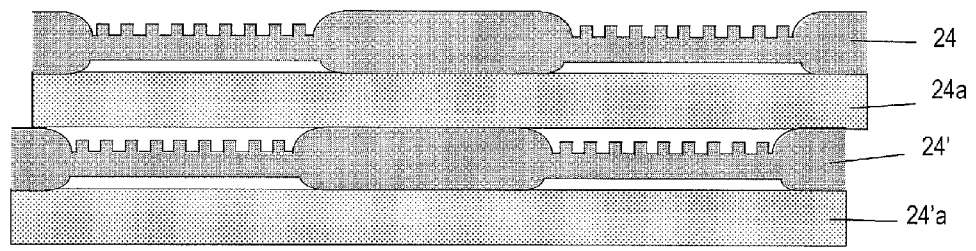

FIGS. 11A to 11C show results of an analysis using a light-trapping sheet having the structure shown in FIG. 10, each showing the relationship between the angle of incidence θ of light from the light source S incident on the light-coupling structure 3' and the transmittance of light that is output to the outside of the light-trapping sheet. The same method as that of the first embodiment was used for the analysis. FIG. 11A shows the results where the wavelength of the light source is Λ=0.45 μm, FIG. 11B shows the results where the wavelength is Λ=0.55 μm, and FIG. 11C shows the results where the wavelength is Λ=0.65 μm. Each figure uses the depth d of the diffraction grating as a parameter, and is also plotting the results obtained under a condition where there is no light-coupling structure (a configuration only with the light-transmitting sheet 2 and the light source S).

A comparison between the results obtained in a case where the light-coupling structures 3' are present but the depth of the diffraction grating is d=0 and the results (Nothing) obtained in a case where there is no light-coupling structure shows that the former is smaller than the latter in a range within the critical angle (41.8°), and they are both zero for angles greater than or equal to that. The reason why the former is smaller within the critical angle is because light incident on the surface 3q of the second light-transmitting layer 3b is refracted and a portion thereof is output from the right side face (the right side face of the third light-transmitting layer 3c) as out-of-critical-angle light, as described above with reference to FIG. 2D.

On the other hand, a comparison between the results for a case where the depth of the grating is d=0.18 μm and the results for a case where d=0 shows that although the transmittance of the former is substantially close to that of the latter, the transmittance drops at positions indicated by arrows a, b, c, d and e. These positions correspond to conditions under which light is coupled to the guided light.

FIG. 11D shows the standard value (a value obtained by division by 90) of a value obtained by integrating each of the curves of FIGS. 11A, 11B and 11C for the angle of incidence θ, using the groove depth d as a parameter. Since the analysis model is two-dimensional, the integrated value is equal to the efficiency with which light in the sheet is taken out of the sheet. With any wavelength, the take-out efficiency decreases as d increases (at least for the comparison between d=0 and d=0.18). This represents the light-confining effect by a single light-coupling structure, as with the analysis results in the first embodiment. This effect can be accumulated, and by increasing the number of light-coupling structures, it is possible to confine all the light. Note that while this analysis is a two-dimensional model, there is always incident light that satisfies Expression 1, which is the coupling condition, for an arbitrary azimuthal angle φ shown in the plan view of FIG. 2A in an actual three-dimensional model, and therefore the transmittance curves shown in FIG. 11A to 11D will drop for the entire range of the angle of incidence θ, rather than for the local range such as the arrows a, b, c, d and e, thus increasing the light-confining effect of the light-coupling structures. The drops at positions of arrows b, c, d and e are smaller as compared with those of the analysis results of the first embodiment because the length of the grating (coupling length) is made smaller in the analysis model of this embodiment.

FIGS. 12A to 12C shows results of an analysis of the second embodiment, each showing the relationship between the angle of incidence θ of light on the end face of a single light-coupling structure and the transmittance thereof out of the light-trapping sheet. In the analysis conditions used, only the position of the light source S is shifted by 5 μm in the x-axis negative direction from the conditions of FIG. 10 or FIG. 3. FIG. 12A shows a case where the wavelength of the light source is Λ=0.45 μm, FIG. 12B a case where the wavelength is Λ=0.55 μm, and FIG. 12C a case where the wavelength is Λ=0.65 μm, wherein each figure shows a comparison between the model of this embodiment and the model of the first embodiment, and is also plotting the results obtained under a condition where there is no light-coupling structure (a configuration only with the light-transmitting sheet 2 and the light source S).

A comparison between the results for the model of the second embodiment and the results (Nothing) obtained in a case where there is no light-coupling structure shows that they substantially coincide with each other in both cases within the critical angle (41.8° or less), but the latter is substantially zero and the former substantially floats from zero outside the critical angle (41.8° or more). The former floats outside the critical angle because, as described above with reference to FIGS. 2C and 2D, light incident on the end face of the first light-transmitting layer 3a and the second light-transmitting layer 3b of the light-coupling structure refracts, and then becomes in-critical-angle light and is output from the first principal surface 2p. In contrast, in the analysis results for the model of the second embodiment, the floating outside the critical angle is partially suppressed. This is because the first light-transmitting layer 3a and the second light-transmitting layer 3b account for no area on the end face of the second embodiment, and the refraction at the end face is somewhat suppressed. Therefore, the second embodiment is a configuration such that the influence at the end face (the phenomenon that out-of-critical-angle light is converted to in-critical-angle light) can be ignored more than in the first embodiment, and can be said to be a configuration having a greater light-confining effect. Note that in FIGS. 12A to 12C, the length of the light source is set to 5 μm. Increasing this length will increase the proportion of a component that that deviates from the end face of the light-coupling structure and is incident directly on the first principal surface 2p to be totally reflected or is totally reflected at the surface 3q of the light-coupling structure, thus reducing the floating outside the critical angle. If the length of the light source is set to 20 μm, which is 4 times more, while the light-coupling structure is set to be about 21 μm, only the floating outside the critical angle, the end face incidence characteristics, is reduced to about ¼.

FIGS. 13A to 13E are schematic cross-sectional views showing an example of a production procedure for the light-trapping sheet 52 of the present embodiment. The light-trapping sheet 52 can be manufactured by using a similar procedure to that of the first embodiment, while providing slopes 25A' and 25B' at the outer edge portions of the minute structures 25A and 25B of the molds 25a and 25b. Except for the shapes of the molds 25a and 25b being different, the light-trapping sheet 52 of the present embodiment can be manufactured in a similar manner to the light-trapping sheet 51 of the first embodiment, and therefore the manufacturing procedure will not be described in detail.

(Third Embodiment)

A third embodiment of a light-trapping sheet according to the present invention will be described. A light-trapping sheet 53 of the present embodiment is different from the light-coupling structure of the second embodiment in terms of the structure at the end face of the light-coupling structure. Therefore, the description hereinbelow will focus on the light-coupling structure of the present embodiment.

Figure 14A:
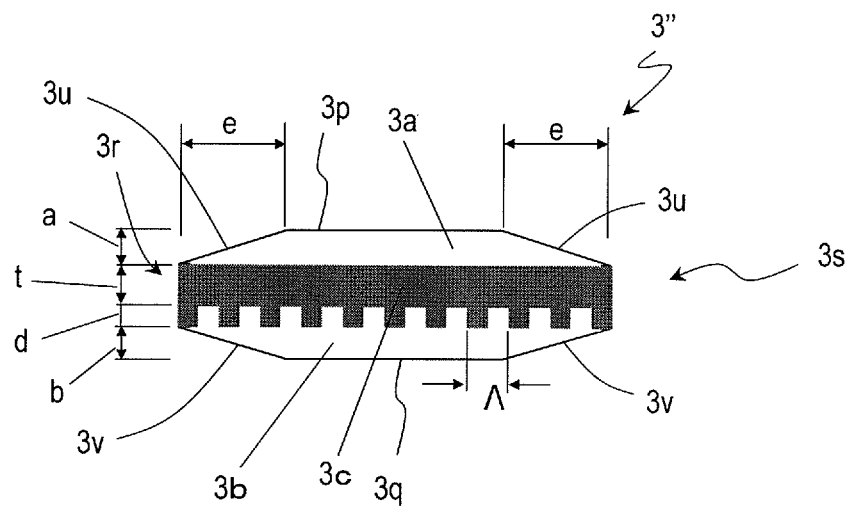
FIGS. 14A and 14B are a schematic cross-sectional view and a plan view showing a light-coupling structure used in a third embodiment of a light-trapping sheet according to the present disclosure.
Figure 14B:
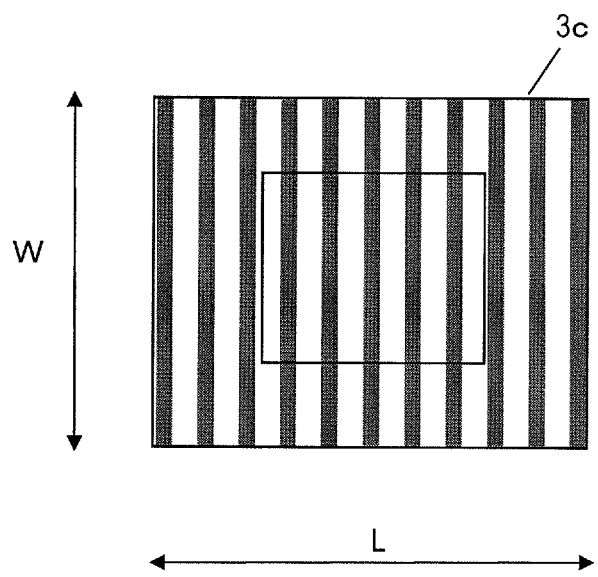

FIGS. 14A and 14B schematically show a cross-sectional structure and a planar structure of a light-coupling structure 3" along the thickness direction of the light-trapping sheet 53. As shown in FIGS. 14A and 14B, on the surfaces 3p and 3q of the light-coupling structure 3", tapered portions 3u and 3v are provided across areas having the width e adjacent to the end faces 3r and 3s. Therefore, the thicknesses of the first light-transmitting layer 3a and the second light-transmitting layer 3b are decreased toward the outer edge side away from the center of the light-coupling structure 3" while maintaining the flatness of the interface between the first light-transmitting layer 3a and the second light-transmitting layer 3b and the third light-transmitting layer 3c.

Figure 15:
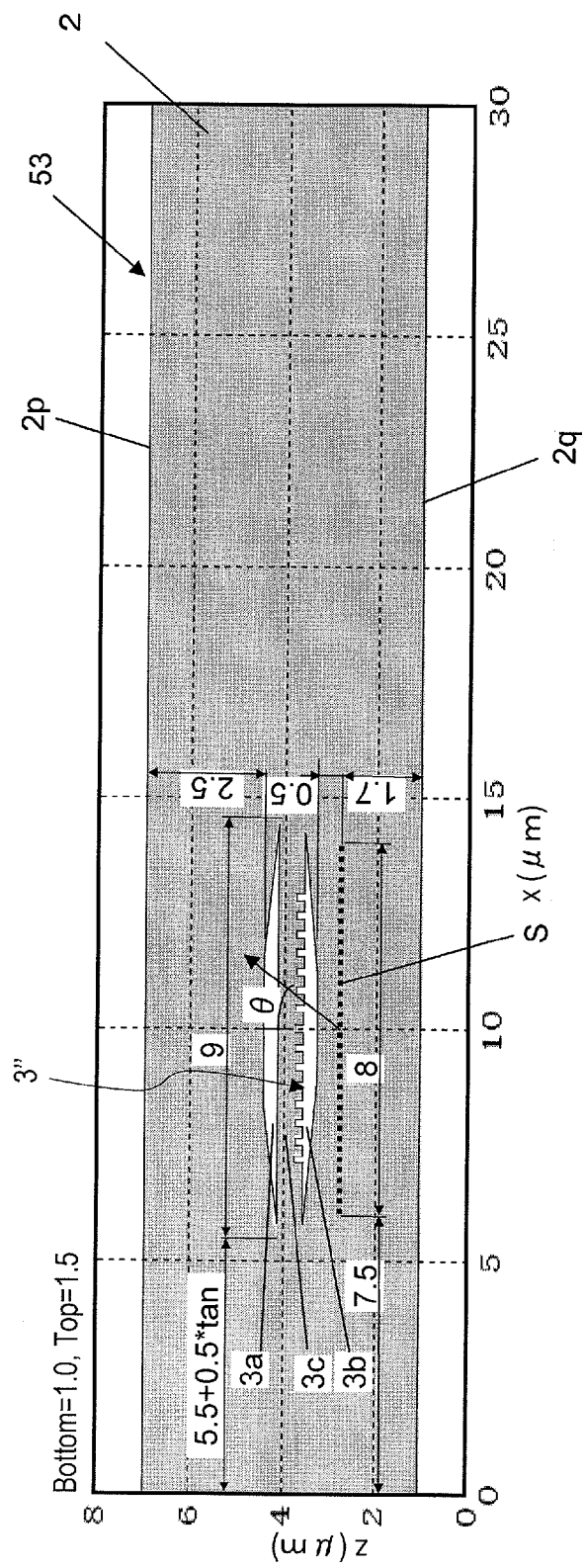
FIG. 15 is a cross-sectional view showing a structure used in analyzing the light-trapping sheet of the third embodiment.

FIG. 15 shows a cross-sectional structure of a light-trapping sheet used in the analysis for confirming the light-confining effect of the light-trapping sheet 53 including the light-coupling structure 3". The light-coupling structure and the light source are provided at just the same positions as those in the structure used in the analysis in the first embodiment (FIG. 3).

Figure 16A:
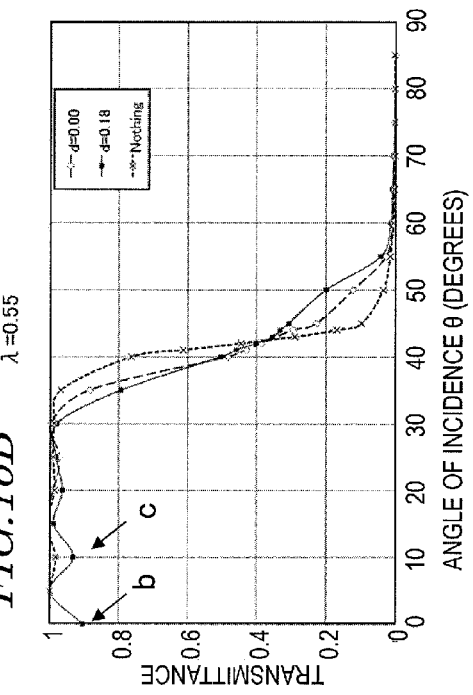
FIGS. 16A to 16D shows results of an analysis conducted using the structure shown in FIG. 15, wherein FIGS. 16A to 16C each show the relationship between the angle of incidence and the transmittance out of the sheet.
Figure 16B:
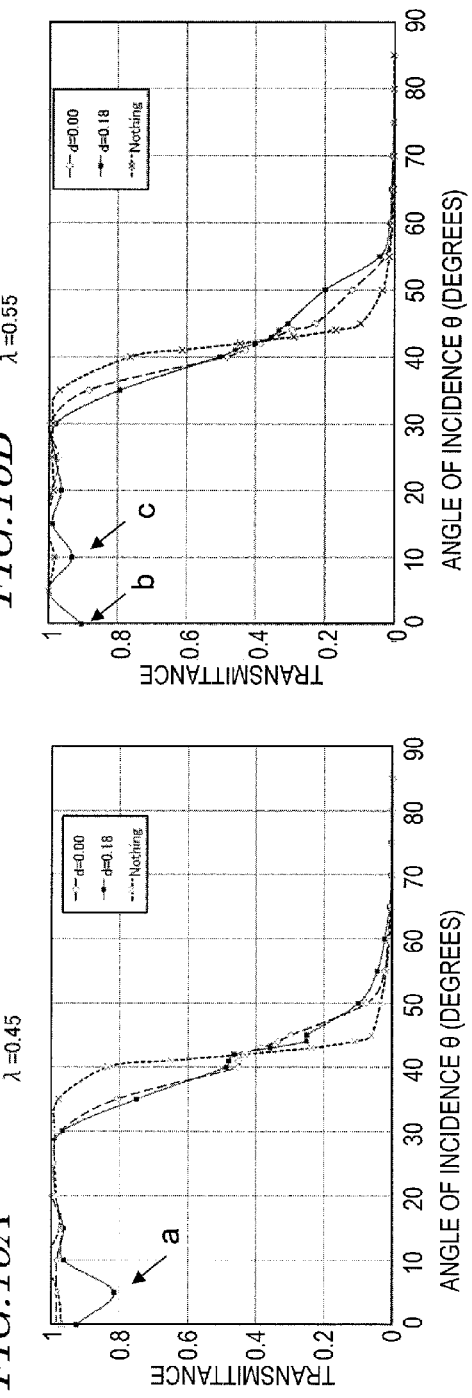
Figure 16C:
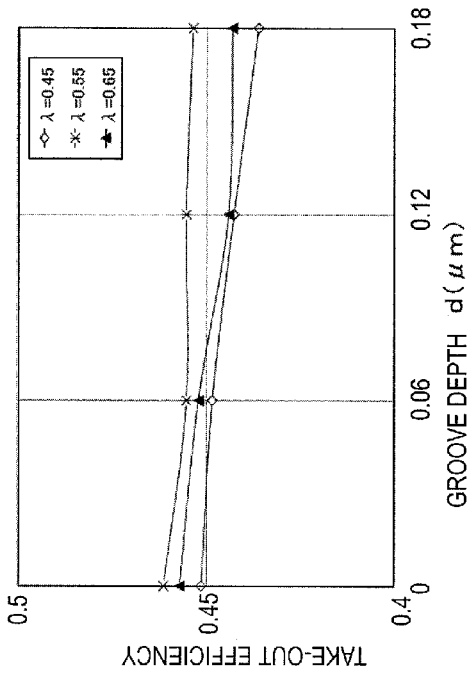

FIGS. 16A to 16C show results of an analysis using a light-trapping sheet having the structure shown in FIG. 15, each showing the relationship between the angle of incidence θ of light from the light source S incident on the side of the light-coupling structure 3' and the transmittance of light that is output to the outside of the light-trapping sheet. The same method as that of the first embodiment was used for the analysis. FIG. 16A is for a case where the wavelength of the light source is Λ=0.45 μm, FIG. 16B for a case where the wavelength is Λ=0.55 μm, and FIG. 16C for a case where the wavelength is Λ=0.65 μm, wherein each figure uses the depth d of the diffraction grating as a parameter, and is also plotting the results obtained under a condition where there is no light-coupling structure (a configuration only with the light-transmitting sheet 2 and the light source S).

A comparison between the results obtained in a case where the light-coupling structures are present but the depth of the grating is d=0 and the results (Nothing) obtained in a case where there is no light-coupling structure shows that the former is smaller than the latter in a range within the critical angle (41.8°), and the latter is zero for angles greater than or equal to the critical angle, whereas floating remains for the former in the range up to 55°. The reason why the former is smaller within the critical angle is because light incident on the surface $3q$ of the second light-transmitting layer $3b$ is refracted and a portion thereof is output from the right side face (the right side face of the third light-transmitting layer $3c$) as out-of-critical-angle light, as described above with reference to FIG. 2D. There are two possible reasons for the former to float for angles greater than or equal to the critical angle. First, the surface $3q$ of the second light-transmitting layer $3b$ is sloped toward the outer edge portion, whereby a portion of light exceeding the critical angle can be incident on the surface $3q$ of the second light-transmitting layer $3b$ within the critical angle, and this light diffracts through the grating inside the light-coupling structure to be in-critical-angle light. Second, the thickness of the second light-transmitting layer $3b$ is too small in the outer edge portion, and a portion of light exceeding the critical angle passes into the inside of the light-coupling structure in the form of evanescent light, and this light diffracts through the grating to be in-critical-angle light.

On the other hand, a comparison between the results for a case where the depth of the diffraction grating is d=0.18 μm and the results for a case where d=0 shows that although the transmittance of the former is substantially close to that of the latter, the transmittance drops at positions of arrows a, b, c, d and e. These positions correspond to conditions under which light is coupled to the guided light, and the light is guided, after which it is radiated from the end face of the third light-transmitting layer $3c$ to be out-of-critical-angle light. This radiated light falls within the range of about ±35° about a propagation angle of 90° (x-axis direction) (see FIGS. 5A to 5E).

In FIGS. 16A to 16E, the floating of transmitted light is suppressed at the angle of incidence of 55° or more, and it becomes substantially zero, indicating that light to be guided light and radiated becomes out-of-critical-angle light (light whose propagation angle is 55° or more) that is repeatedly totally reflected and stays inside the sheet. Note that as the surface $3p$ of the first light-transmitting layer $3a$ and the surface $3q$ of the second light-transmitting layer $3b$ are sloped toward the outer edge portion, the propagation angle of light that is totally reflected at these surfaces increases and decreases depending on the slope direction, but since they occur with the same probability, it is possible to maintain substantially the same propagation angle as a whole.

Figure 16D:
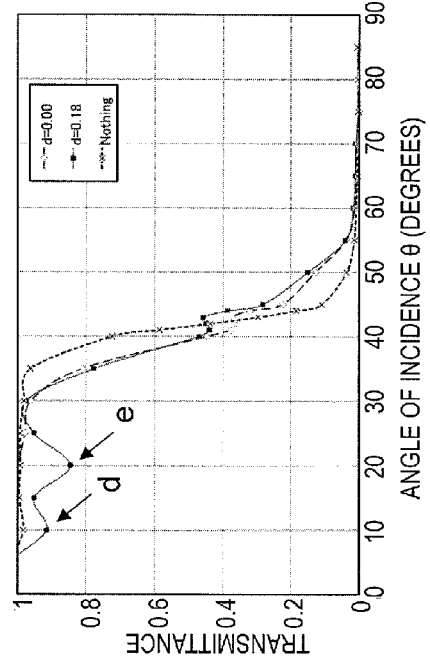

FIG. 16D shows the standard value (a value obtained by division by 90) of a value obtained by integrating each of the curves of FIGS. 16A, 16B and 16C for the angle of incidence θ, using the groove depth d as a parameter. Since the analysis model is two-dimensional, the integrated value is equal to the efficiency with which light in the sheet is taken out of the sheet. With any wavelength, the take-out efficiency decreases as d increases (at least for the comparison between d=0 and d=0.18). This represents the light-confining effect by a single light-coupling structure, as with the analysis results of the first embodiment. This effect can be accumulated, and by increasing the number of light-coupling structures, it is possible to confine all the light. Note that while this analysis is a two-dimensional model, there is always incident light that satisfies Expression 1, which is the coupling condition, for an arbitrary azimuthal angle φ shown in the plan view of FIG. 2A in an actual three-dimensional model, and therefore the transmittance curves shown in FIGS. 16A to 16E will drop for the entire range of the angle of incidence θ, rather than for the local range such as the arrows a, b, c, d and e, thus increasing the light-confining effect of the light-coupling structures.

Figure 17A:
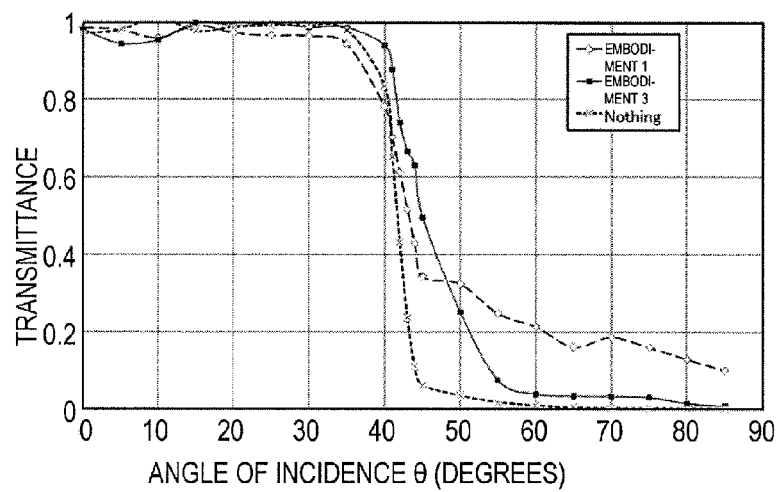
FIGS. 17A to 17C shows results of an analysis conducted using the structures shown in FIGS. 3 and 15 where the position of the light source is shifted by 5 μm in the x-axis negative direction, wherein FIGS. 17A to 17C each show the relationship between the angle of incidence of light on the end face of a single light-coupling structure and the transmittance thereof out of the sheet.
Figure 17B:
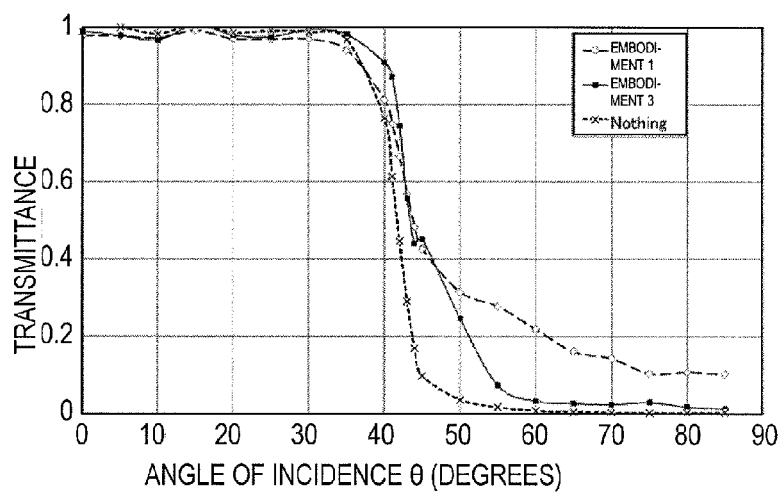
Figure 17C:
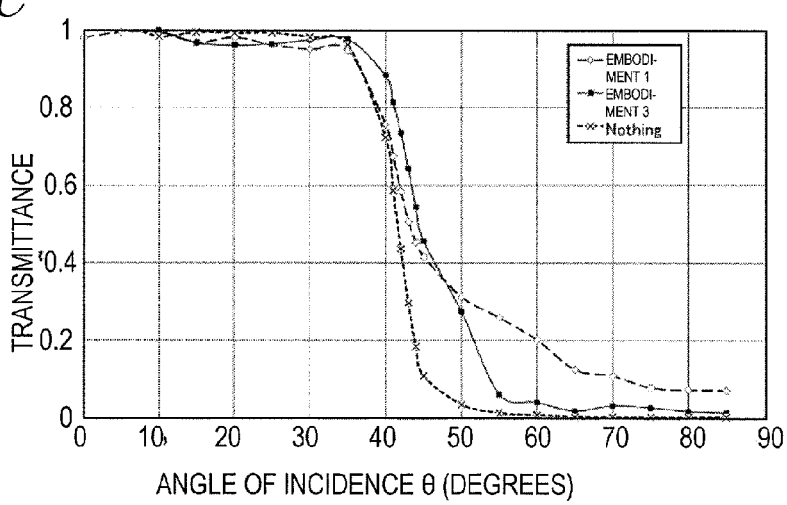

FIGS. 17A to 17C show results of an analysis using the sheet of the third embodiment, each showing the relationship between the angle of incidence θ of light on the end face of a single light-coupling structure and the transmittance thereof out of the light-trapping sheet. In the analysis conditions used, only the position of the light source S is shifted by 5 μm in the x-axis negative direction from the conditions of FIG. 15 or FIG. 3. FIG. 17A shows a case where the wavelength of the light source is Λ=0.45 μm, FIG. 17B a case where the wavelength is Λ=0.55 μm, and FIG. 17C a case where the wavelength is Λ=0.65 μm, wherein each figure shows a comparison between the model of this embodiment and the model of Embodiment 1, and is also plotting the results obtained under a condition where there is no light-coupling structure (a configuration only with the light-transmitting sheet 2 and the light source S). A comparison between the results for the model of Embodiment 1 and the results (Nothing) obtained in a case where there is no light-coupling structure shows that they substantially coincide with each other in both cases within the critical angle (41.8° or less), but the latter is substantially zero and the former substantially floats outside the critical angle (41.8° or more). The former floats outside the critical angle because, as described above with reference to FIGS. 2C and 2D, light incident on the end face of the first light-transmitting layer $3a$ and the second light-transmitting layer $3b$ of the light-coupling structure refracts, and then becomes in-critical-angle light and is output from the upper surface. In contrast, with the results for the model of the third embodiment, the floating is significantly suppressed to be substantially zero in the range where the angle of incidence is 55° or more. This is because the first light-transmitting layer $3a$ and the second light-transmitting layer $3b$ account for no area on the end face of the third embodiment, and a component that is supposed to refract through the end face is totally reflected at the sloped surface $3q$ of the second light-transmitting layer $3b$. Therefore, the third embodiment is a configuration such that the influence at the end face (the phenomenon that out-of-critical-angle light is converted to in-critical-angle light) can be ignored more than in the first embodiment or the second embodiment, and can be said to be a configuration having a greater light-confining effect.

The light-trapping sheet 53 can be manufactured by the following method, for example. FIGS. 18A to 18F are schematic cross-sectional configuration views showing a manufacturing procedure of the light-trapping sheet 53, and FIGS. 8A and 8B are schematic plan views each showing a pattern of a mold surface for producing the sheet. In FIG. 19A, the surface of the mold 25*a* is a plane, and rectangular minute structures 25A of the same size are two-dimensionally arranged, for example, on the surface of the mold 25*a*. The rectangular minute structure 25A is a diffraction grating having a height of d and a pitch of Λ. The azimuth of the diffraction grating varies from one minute structure 25A to another. While diffraction gratings of 45°-interval azimuths, i.e., 0°, 45°, 90° and 135°, are arranged regularly in FIG. 19A, gratings may be arranged in practice with an equal frequency at smaller azimuths intervals, e.g., 30° or 15°. The rectangular minute structures 25B and 25B' are two-dimensionally arranged also on the surfaces of the molds 25*b* and 25*b*' of FIG. 19B. The pitch of the arrangement of the minute structures 25B and 25B' is equal to the pitch of the arrangement of the minute structures 25A. The minute structures 25B and 25B' are depressed portions with planar bottoms. The depth of the depressed portion is equivalent to the dimension a or b of FIGS. 14A and 14B. The minute structures 25A of the mold 25*a* are so large that their square shapes are almost in contact with one another (they may be in contact with one another), the minute structures 25B and 25B' of the molds 25*b* and 25*b*' are smaller.

Figure 18A:
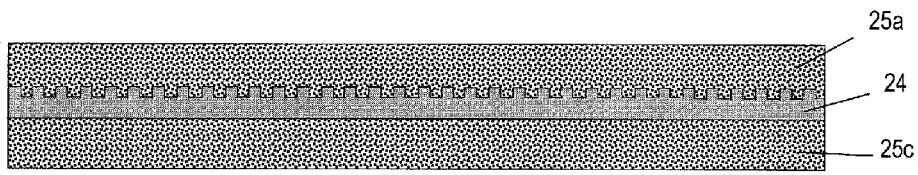
FIGS. 18A to 18F are schematic cross-sectional views showing a manufacturing procedure of the light-trapping sheet of the third embodiment.
Figure 18B:
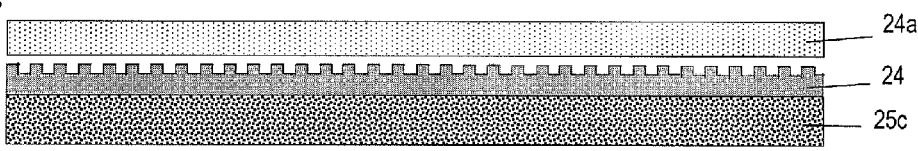
Figure 19A:
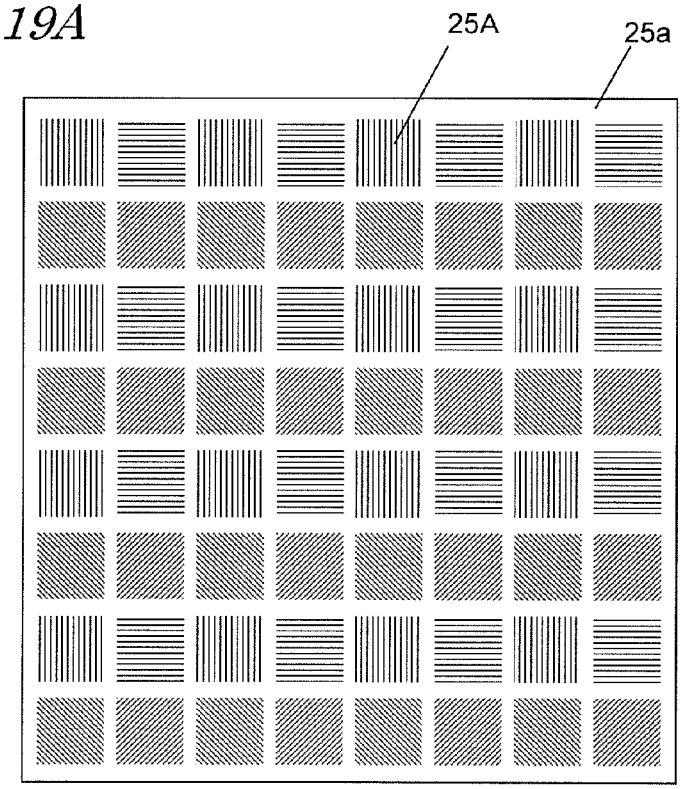
FIGS. 19A and 19B are schematic plan views each showing a surface pattern of a mold used in manufacturing the light-trapping sheet of the third embodiment.
Figure 19B:
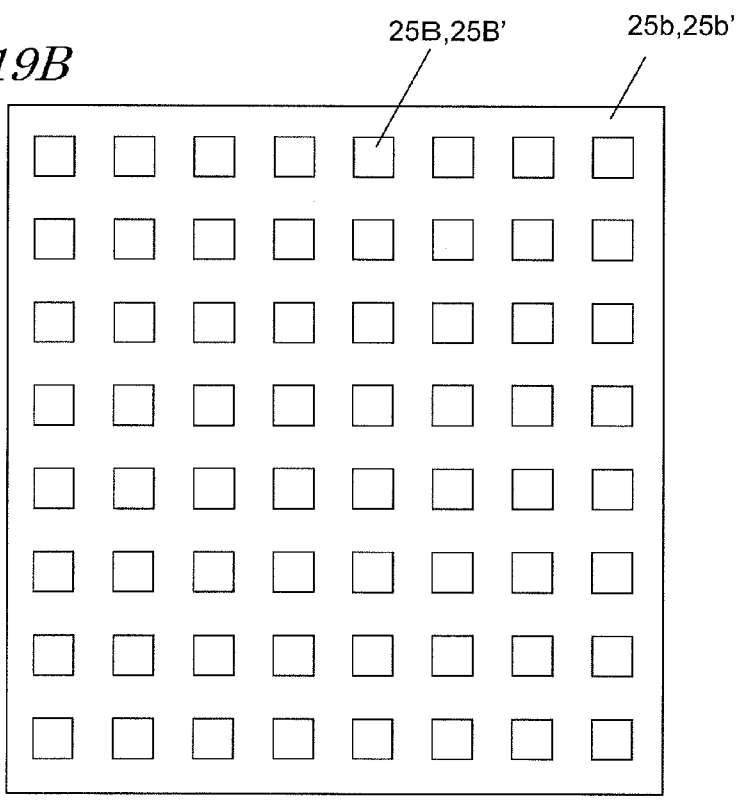

As shown in FIG. 18A, the transparent resin sheet 24 is laid on a mold 25*c* having a flat surface and, with a thin layer of a spacer agent applied thereon, is pressed by the mold 25*a*. As shown in FIG. 18B, the mold 25*a* is lifted to peel the mold 25*a* off the resin sheet, and the flat resin sheet 24*a* is laid on the resin sheet 24, onto which a diffraction grating has been transferred.

Figure 18C:
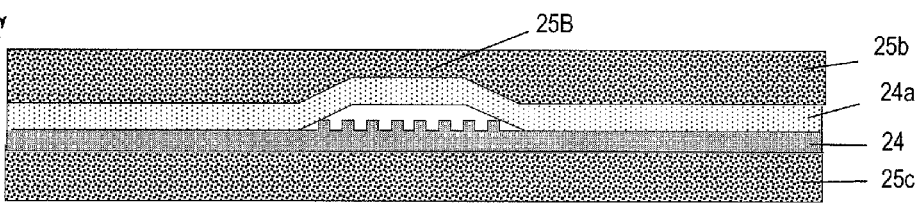
Figure 18D:
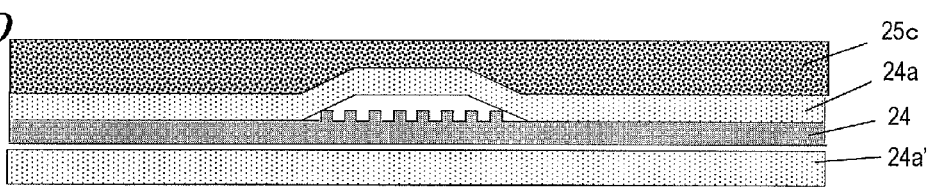
Figure 18E:
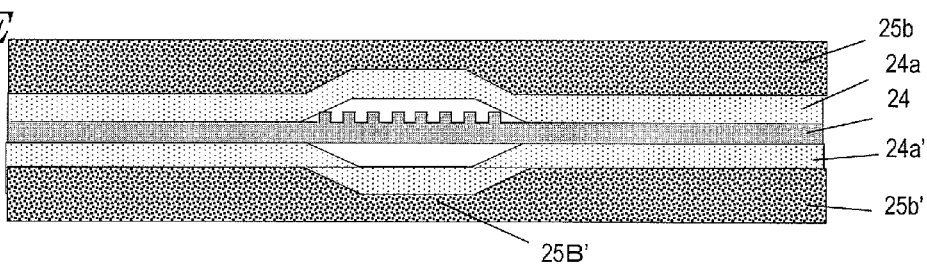
Figure 18F:
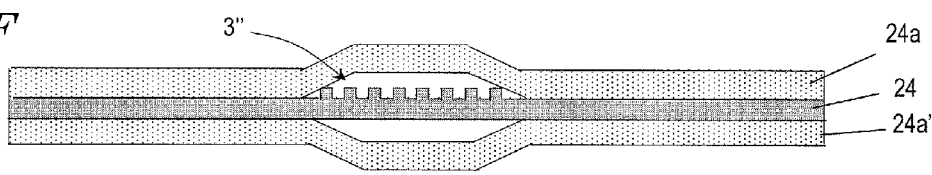

As shown in FIG. 18C, the resin sheet 24 and the resin sheet 24*a* are pressed by the mold 25*b* while being heated, and the resin sheet 24*a* is raised in the area of a depression 25B of the mold 25*b* while attaching the resin sheet 24 and the resin sheet 24*a* together in the other area. In this process, the diffraction grating is all buried to disappear in the attached portion, and remains only in the area where the resin sheet 24*a* is raised. Raising the resin sheet 24*a* forms an air layer (or a vacuum layer) between the resin sheet 24*a* and the resin sheet 24. As shown in FIG. 18D, the mold 25*c* is lifted to peel the mold 25*c* off the resin sheet 24, and a resin sheet 24*a*' is laid under the resin sheet 24. As shown in FIG. 18E, the resin sheet 24 and the resin sheet 24*a*' are pressed by a mold 25*b*' while being heated, and the resin sheet 24*a*' is raised in the area of a depression 25B' of the mold 25*b*' while attaching the resin sheet 24 and the resin sheet 24*a*' together in the other area. The rise of the resin sheet 24*a*' forms an air layer (or a vacuum layer) between the resin sheet 24*a*' and the resin sheet 24. As shown in FIG. 18F, the molds 25*b* and 25*b*' are peeled off, completing an attached sheet of the resin sheet 24*a*, the resin sheet 24 and the resin sheet 24*a*'. Thereafter, these attached sheets are bonded together via an adhesive layer therebetween, and the process is repeated, thereby producing the third area 2*c* of the light-transmitting sheet 2 shown in FIG. 1A. A resin sheet to be the first area 2*a* and the second area 2*b* of the light-transmitting sheet 2 is bonded to the front surface and the reverse surface of the third area 2*c* of the light-transmitting sheet 2, thereby completing the light-trapping sheet 53. Note that anti-reflective nanostructures may be formed in advance on the surface of the resin sheet to be the resin sheets 24*a* and 24*a*', the first area 2*a* and the second area 2*b*.

In embodiments hereinbelow, descriptions with respect to the cover sheets 2*e* will be omitted because they are the same as, and redundant with, those given in the first embodiment. Moreover, although examples where there is a single layer of the light-transmitting sheet 2 will be described for the sake of simplicity, it actually has, a layered configuration as in the first embodiment, in which case the photoelectric conversion section, the protrusion/depression (diffraction) structure, and the like, are formed on the surface of one of the light-transmitting sheets 2 layered together that is located on the side of the outermost surface.

(Fourth Embodiment)

Figure 20:
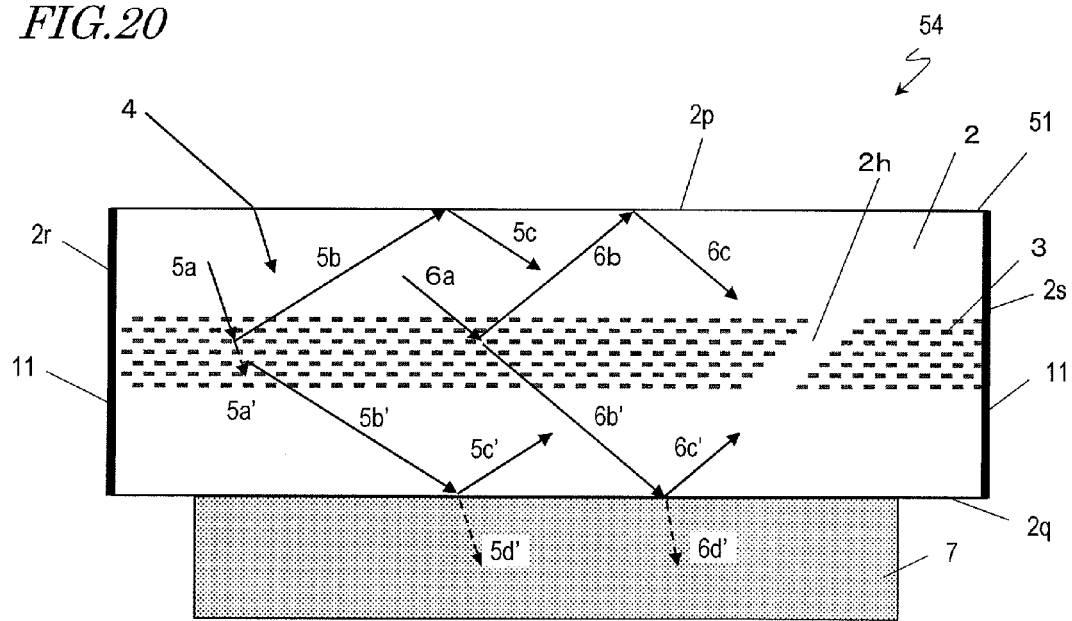
FIG. 20 is a schematic cross-sectional view showing an embodiment of a light-receiving device according to the present invention.

An embodiment of a light-receiving device according to the present disclosure will be described. FIG. 20 schematically shows a cross-sectional structure of a light-receiving device 54 of the present embodiment. The light-receiving device 54 includes the light-trapping sheet 51 of the first embodiment and a photoelectric conversion section 7. The light-trapping sheet 52 of the second embodiment or the light-trapping sheet 53 of the third embodiment may be used instead of the light-trapping sheet 51.

A reflective film 11 is preferably provided on end faces 2*s* and 2*r* of the light-trapping sheet 51. The photoelectric conversion section 7 is provided adjacent to the second principal surface 2*q* of the light-trapping sheet 51. If the light-transmitting sheet 2 has a plurality of end faces, the reflective film 11 may be provided on all of the end faces. In the present embodiment, a portion of the second principal surface 2*q* and a light-receiving portion of the photoelectric conversion section 7 are in contact with each other. The photoelectric conversion section 7 may be provided in a portion of the first principal surface 2*p* of the light-trapping sheet 51.

By covering the end faces 2*r* and 2*s* of the light-trapping sheet 51 with the reflective film 11, light that has been taken and enclosed in the light-trapping sheet 51 will circulate in the light-trapping sheet 51.

The photoelectric conversion section 7 is a solar cell formed by a silicon. A plurality of photoelectric conversion sections 7 may be attached to one sheet of light-trapping sheet 51. Since the refractive index of silicon is about 5, even if light is made incident perpendicularly on the light-receiving surface of a solar cell, around 40% of the incident light is normally lost through reflection without being taken in the photoelectric conversion section 7. The reflection loss further increases when the light is incident diagonally. Although an AR coat or anti-reflective nanostructures are formed on the surface of a commercially-available solar cell in order to reduce the amount of reflection, a sufficient level of performance has not been achieved. Moreover, a metal layer is present inside the solar cell, and a large portion of light that is reflected by the metal layer is radiated to the outside. With an AR coat or anti-reflective nanostructures, the reflected light is radiated to the outside with a high efficiency.

In contrast, the light-trapping sheet of the present disclosure takes in and encloses light for every visible light wavelength and for every angle of incidence in the light-trapping sheet. Therefore, with the light-receiving device 54, light entering through the first principal surface 2*p* of the light-trapping sheet 51 is taken into the light-trapping sheet 51 and circulates in the light-trapping sheet 51. Since the refractive index of silicon is larger than the refractive index of the light-transmitting sheet 2, the out-of-critical-angle light 5*b*' and 6*b*' incident on the second principal surface 2*q* are not totally reflected but portions thereof are transmitted into the photoelectric conversion section 7 as refracted light 5*d*' and 6*d*' and are converted to electric current in the photoelectric conversion section. After the reflected out-of-critical-angle light 5*c*' and 6*c*' propagate inside the photoelectric conversion section 7, they enter again and are used in photoelectric conversion until all the enclosed light is gone. Assuming that the refractive index of the transmissive sheet 2 is 1.5, the reflectance of light that is incident perpendicularly on the first principal surface 2p is about 4%, but the reflectance can be suppressed to 1 to 2% or less, taking into account the wavelength dependency and the angle dependency, if an AR coat or anti-reflective nanostructures are formed on the surface thereof. Light other than this enters to be confined within the light-trapping sheet 51, and is used in photoelectric conversion.

With the light-receiving device of the present embodiment, most of the incident light can be confined within the sheet, most of which can be used in photoelectric conversion. Therefore, it is possible to significantly improve the energy conversion efficiency of the photoelectric conversion section. The light-receiving area is determined by the area of a first principal surface p, and all of the light received by this surface enters the photoelectric conversion section 7. Therefore, it is possible to reduce the area of the photoelectric conversion section 7 or reduce the number of photoelectric conversion sections 7, thereby realizing a significant cost reduction of the light-receiving device.

(Fifth Embodiment)

Figure 21:
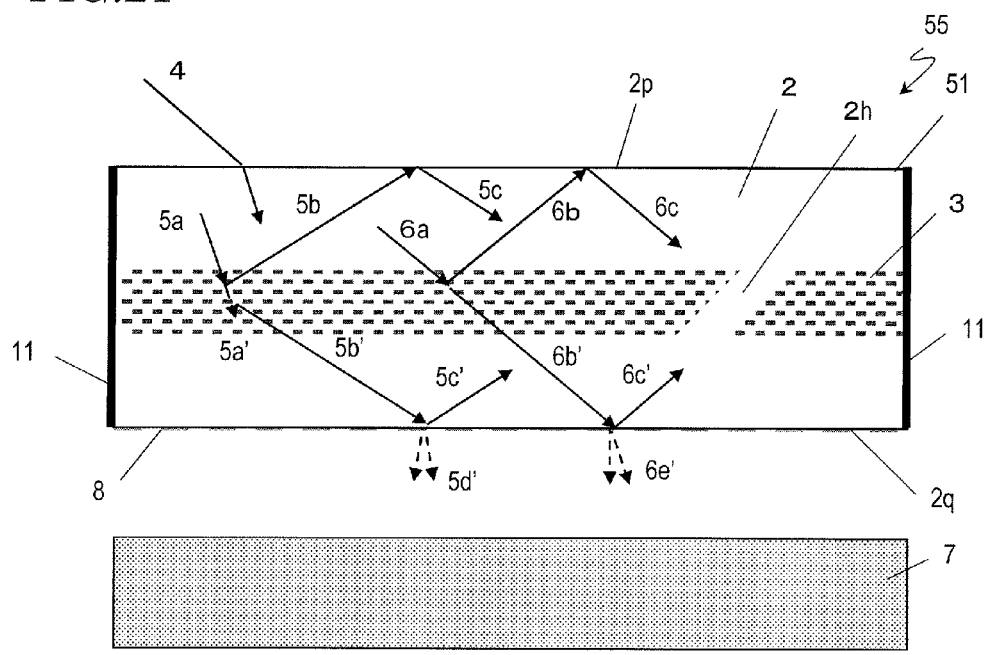
FIG. 21 is a schematic cross-sectional view showing another embodiment of a light-receiving device according to the present disclosure.

Another embodiment of a light-receiving device of the present disclosure will be described. FIG. 21 schematically shows a cross-sectional structure of a light-receiving device 55 of the present embodiment. The light-receiving device 55 includes the light-trapping sheet 51 of the first embodiment and the photoelectric conversion section 7. The light-trapping sheet 52 of the second embodiment or the light-trapping sheet 53 of the third embodiment may be used instead of the light-trapping sheet 51.

The light-receiving device 55 is different from the light-receiving device 54 of the fourth embodiment in that a protrusion/depression (diffraction) structure 8 is provided on the second principal surface 2q, with a gap between the protrusion/depression (diffraction) structure 8 and the photoelectric conversion section 7. The protrusion/depression (diffraction) structure 8 provided on the second principal surface 2q includes depressed portions and protruding portions whose width is 0.1 µm or more and which may be in a periodic pattern or a random pattern. With the protrusion/depression (diffraction) structure 8, the out-of-critical-angle light 5b' and 6b' incident on the second principal surface 2q are not totally reflected, and portions thereof travel toward the photoelectric conversion section 7 as output light 5d' and 6d' to undergo photoelectric conversion. Light that are reflected by the surface of the photoelectric conversion section 7 are taken inside through the second principal surface 2q of the light-trapping sheet 51 and propagates inside the light-trapping sheet 51, after which the light again travel toward the photoelectric conversion section 7 as the output light 5d' and 6d'. Therefore, also with the light-receiving device of the present embodiment, most of the incident light can be confined within the light-trapping sheet, most of which can be used in photoelectric conversion. As in the fourth embodiment, it is possible to reduce the area of the photoelectric conversion section 7 or reduce the number of photoelectric conversion sections 7. Therefore, it is possible to realize a light-receiving device having a significantly improved energy conversion efficiency and being capable of cost reduction.

(Sixth Embodiment)

Figure 22:
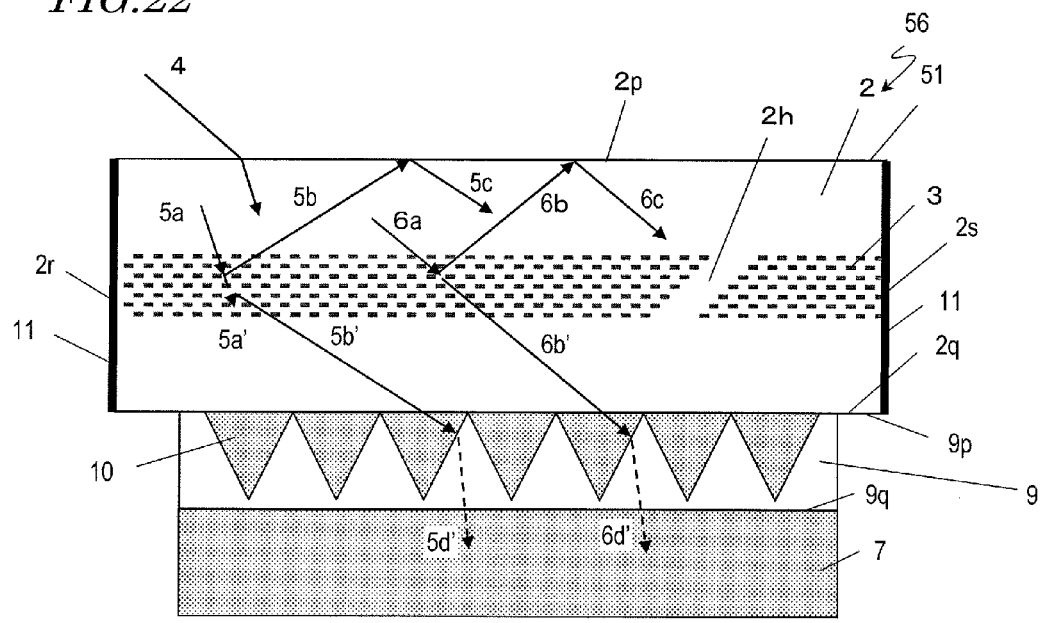
FIG. 22 is a schematic cross-sectional view showing another embodiment of a light-receiving device according to the present disclosure.

Another embodiment of a light-receiving device of the present disclosure will be described. FIG. 22 schematically shows a cross-sectional structure of a light-receiving device 56 of the present embodiment. The light-receiving device 56 includes the light-trapping sheet 51 of the first embodiment, the photoelectric conversion section 7, and a prism sheet 9. The light-trapping sheet 52 of the second embodiment or the light-trapping sheet 53 of the third embodiment may be used instead of the light-trapping sheet 51.

The light-receiving device 56 is different from the light-receiving device 54 of the fourth embodiment in that the prism sheet 9 is provided between the second principal surface 2q and the photoelectric conversion section 7. Tetrahedron prisms 10 are arranged adjacent to one another inside the prism sheet 9. The prism sheet 9 may be formed by layering together two triangular prism array sheets orthogonal to each other. Since the refractive index of the prism 10 is set to be larger than the refractive index of the prism sheet 9, the out-of-critical-angle light 5b' and 6b' incident on the surface of the prism sheet 9 are refracted by the prism surface to be 5d' and 6d' and travel toward the photoelectric conversion section 7. Since the angle of incidence of light to the photoelectric conversion section 7 is close to perpendicular, it is possible to reduce the reflection at the light-receiving surface of the photoelectric conversion section 7 and to reduce the number of light circulations within the light-trapping sheet 51 as compared with the fourth embodiment.

Also with the light-receiving device of the present embodiment, most of the incident light can be confined within the light-trapping sheet, most of which can be used in photoelectric conversion. As in the fourth embodiment, it is possible to reduce the area of the photoelectric conversion section 7 or reduce the number of photoelectric conversion sections 7. Therefore, it is possible to realize a light-receiving device having a significantly improved energy conversion efficiency and being capable of cost reduction. Since the number of light circulations within the sheet is smaller than the fourth embodiment, it is less influenced by the light enclosing capacity of the light-trapping sheet.

(Seventh Embodiment)

Figure 23:
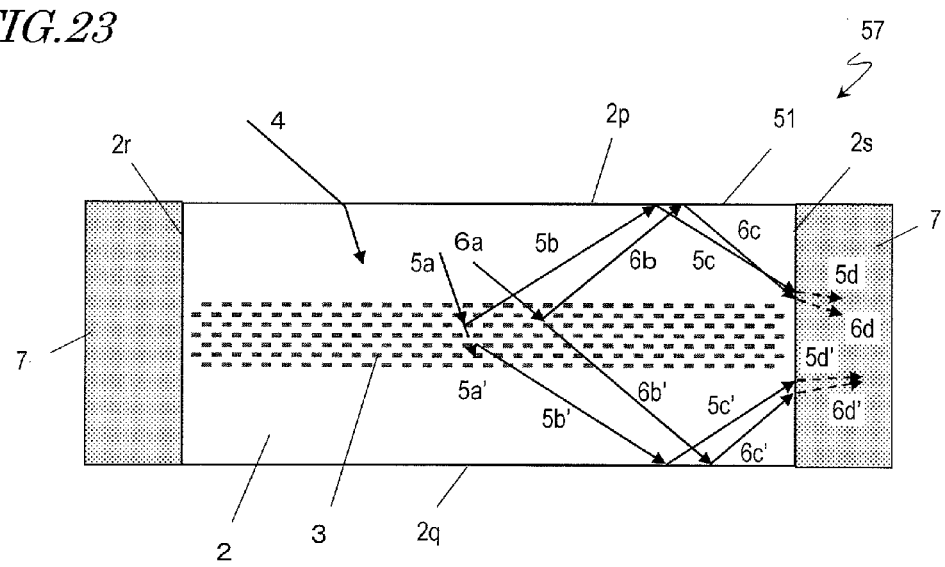
FIG. 23 is a schematic cross-sectional view showing another embodiment of a light-receiving device according to the present disclosure.

Another embodiment of a light-receiving device of the present disclosure will be described. FIG. 23 schematically shows a cross-sectional structure of a light-receiving device 57 of the present embodiment. The light-receiving device 57 includes the light-trapping sheet 51 of the first embodiment and the photoelectric conversion section 7. The light-trapping sheet 52 of the second embodiment or the light-trapping sheet 53 of the third embodiment may be used instead of the light-trapping sheet 51.

The light-receiving device 57 is different from the light-receiving device 54 of the fourth embodiment in that the end faces 2s and 2r are covered by the photoelectric conversion section 7 instead of the reflective film 11. If the light-transmitting sheet 2 has a plurality of end faces, the photoelectric conversion section 7 may be provided on all of the end faces. In the present embodiment, the fourth area 2h may be absent in the light-trapping sheet 51.

When the photoelectric conversion section 7 is provided on the end faces 2s and 2r, the out-of-critical-angle light 5c, 6c, 5c' and 6c' enter the photoelectric conversion section 7 along the normal to the light-receiving surface of the photoelectric conversion section 7, as opposed to the fourth embodiment. Therefore, there is less reflection at the surface of the photoelectric conversion section 7, and it is possible to reduce the number of light circulations within the light-trapping sheet 51.

Also with the light-receiving device of the present embodiment, most of the incident light can be confined within the light-trapping sheet, most of which can be used in photoelectric conversion. Therefore, it is possible to realize a light-receiving device having a significantly improved energy conversion efficiency. Since the area of the photoelectric conversion section 7 can be reduced as compared with the fourth embodiment, it is possible to significantly reduce the cost. Since the number of light circulations within the sheet is smaller than the fourth embodiment, it is less influenced by the light enclosing capacity of the light-trapping sheet.

(Eighth Embodiment)

Figure 24:
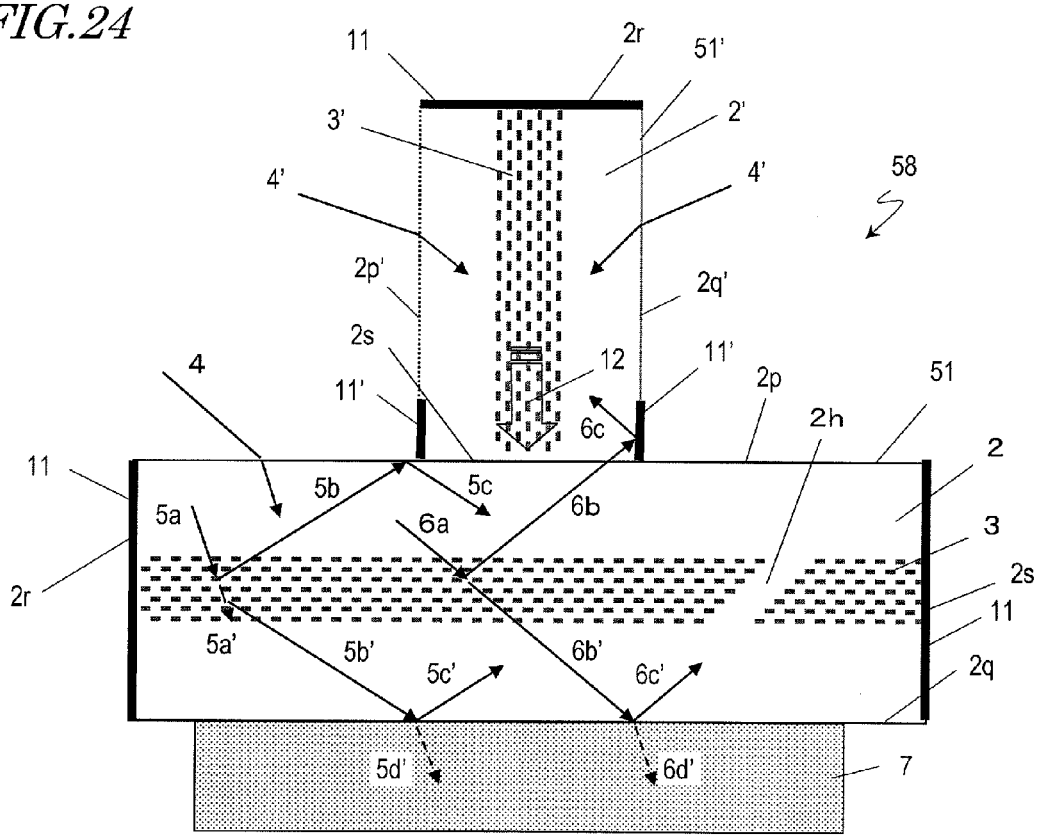
FIG. 24 is a schematic cross-sectional view showing another embodiment of a light-receiving device according to the present disclosure.

Another embodiment of a light-receiving device of the present disclosure will be described. FIG. 24 schematically shows a cross-sectional structure of a light-receiving device 58 of the present embodiment. The light-receiving device 58 includes light-trapping sheets 51 and 51', and the photoelectric conversion section 7. The first light-trapping sheet 51, the light-trapping sheet 52 of the second embodiment or the light-trapping sheet 53 of the third embodiment may be used, independently, instead of the light-trapping sheets 51 and 51'. In the present embodiment, the fourth area 2h may be absent in the light-trapping sheet 51'.

The light-receiving device 58 is different from the fourth embodiment in that the attachment is such that the end face 2s of the light-trapping sheet 51 is in contact with the first principal surface 2p of the light-receiving device 54 of the fourth embodiment. The light-trapping sheet 51' may be attached orthogonal to the light-trapping sheet 51. In the light-trapping sheet 51', the reflective film 11 may be provided on the end face 2r, and a reflective film 11' may be provided on a first principal surface 2p' and a second principal surface 2q' in the vicinity of the end face 2s which is attached to the light-trapping sheet 51. The reflective film 11' serves to reflect the light 6b so as to prevent the out-of-critical-angle light 6b from the light-trapping sheet 51 from leaking out of the light-trapping sheet 51'.

The light 4 incident on the first principal surface 2p of the light-trapping sheet 51 is taken into the light-trapping sheet 51. On the other hand, light 4' incident on the first principal surface 2p' and the second principal surface 2q' of the light-trapping sheet 51' is taken into the light-trapping sheet 51'. Light taken into the light-trapping sheet 51' becomes guided light 12 propagating toward the end face 2s, since the end face 2r is covered by the reflective film 11, and merges with the light inside the light-trapping sheet 51. Since a portion of the second principal surface 2q in the light-trapping sheet 51 is in contact with the surface of the photoelectric conversion section 7, and the refractive index of silicon is larger than the refractive index of the light-transmitting sheet 2, the out-of-critical-angle light 5b' and 6b' incident on the second principal surface 2q are not totally reflected but portions thereof are incident on the photoelectric conversion section 7 as the refracted light 5d' and 6d' and are converted to electric current in the photoelectric conversion section 7. The reflected out-of-critical-angle light 5c' and 6c' propagate inside the light-trapping sheet 51, are incident again on the light-receiving surface of the photoelectric conversion section 7, and are used in photoelectric conversion until the enclosed light is mostly gone.

Since the light-receiving device of the present embodiment includes the light-trapping sheet 51' perpendicular to the light-receiving surface of the photoelectric conversion section 7, even light that is incident diagonally on the first principal surface 2p of the light-trapping sheet 51 is incident, at an angle close to perpendicular, on the first principal surface 2p' and the second principal surface 2q' of the light-trapping sheet 51'. This makes it easier to take in light of every azimuth.

Also with the light-receiving device of the present embodiment, most of the incident light can be confined within the light-trapping sheet, most of which can be used in photoelectric conversion. As in the fourth embodiment, it is possible to reduce the area of the photoelectric conversion section 7 or reduce the number of photoelectric conversion sections 7. Therefore, it is possible to realize a light-receiving device having a significantly improved energy conversion efficiency and being capable of cost reduction.

(Ninth Embodiment)

Figure 25:
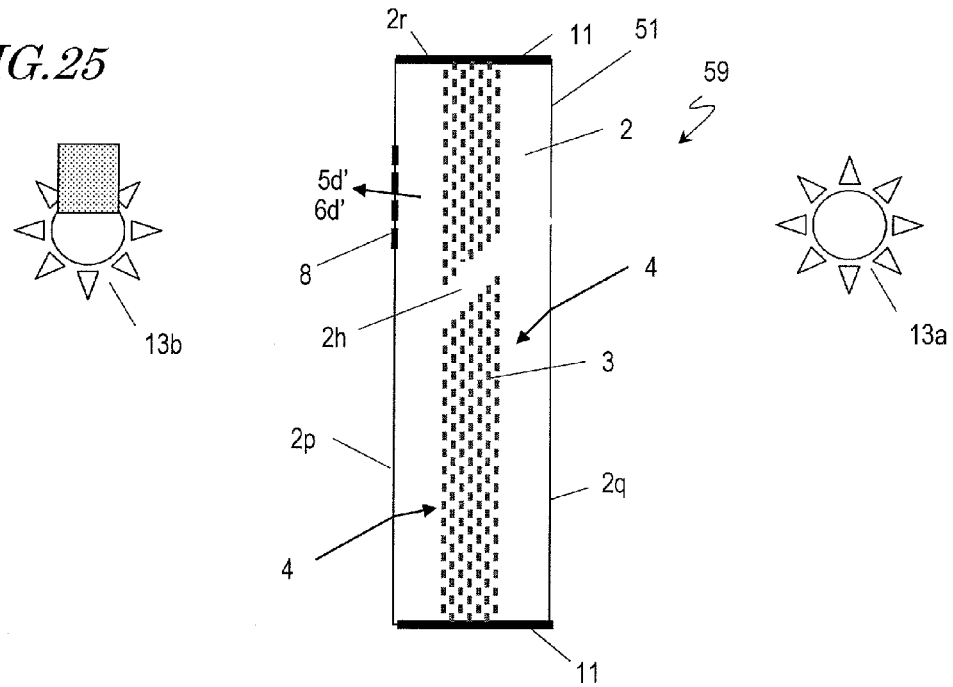
FIG. 25 is a schematic cross-sectional view showing an embodiment of a lighting plate according to the present disclosure.

An embodiment of a lighting plate according to the present disclosure will be described. FIG. 25 schematically shows a cross-sectional structure of a lighting plate 59 of the present embodiment. The lighting plate 59 includes the light-trapping sheet 51 of the first embodiment, and the protrusion/depression (diffraction) structure 8 provided on portions of the first principal surface 2p and the second principal surface 2q of the light-trapping sheet 51. The light-trapping sheet 52 of the second embodiment or the light-trapping sheet 53 of the third embodiment may be used instead of the light-trapping sheet 51. In the light-trapping sheet 51, the reflective film 11 is provided on the end faces 2r and 2s.

The protrusion/depression structure 8 is formed on a portion of the first principal surface 2p, forms a random pattern of depressed portions and protruding portions whose width is 0.1 μm or more. Light taken into the light-trapping sheet 51 propagates inside the light-trapping sheet 51, and portions of the propagating light are radiated outside as the output light 5d and 6d by the protrusion/depression structure 8.

The lighting plate 59 is provided on a window for lighting of a building such as a house so that the first principal surface 2p with the protrusion/depression structure 8 provided thereon is facing the room side. During the day, the lighting plate 59 takes in the light of the sun 13a through the second principal surface 2q, and radiates it into the room through the protrusion/depression structure 8. Thus, it can be used as an indoor lighting in which light is radiated from the protrusion/depression structure 8. During the night, the lighting plate 59 takes in light from an indoor lighting 13b through the first principal surface 2p, and radiates the light through the protrusion/depression structure 8. Thus, the lighting plate 59 can be used as an auxiliary to an indoor lighting. Thus, with the lighting plate of the present embodiment, it is possible to confine most of the incident light within the sheet, and reuse it as a lighting, thereby realizing an efficient use of energy.

(Tenth Embodiment)

Figure 26:
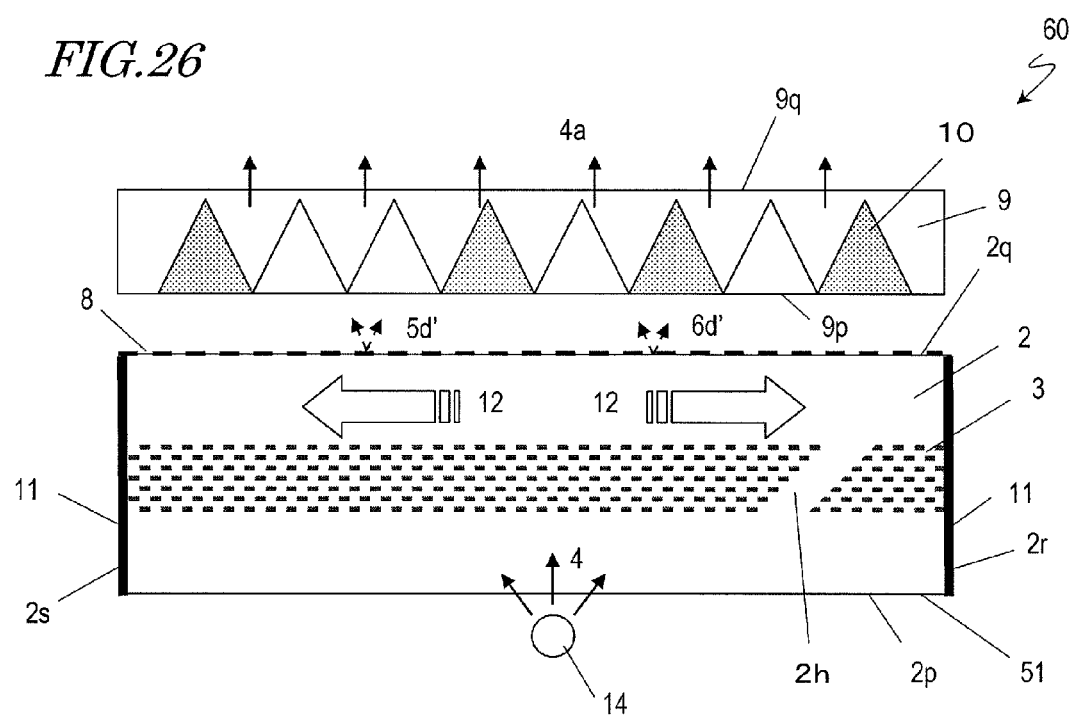
FIG. 26 is a schematic cross-sectional view showing an embodiment of a light-emitting device according to the present disclosure.

An embodiment of a light-emitting device according to the present disclosure will be described. FIG. 26 schematically shows a cross-sectional structure of a light-emitting device 60 of the present embodiment. The light-emitting device 60 includes the light-trapping sheet 51, a light source 14, and the prism sheet 9. The light-trapping sheet 52 of the second embodiment or the light-trapping sheet 53 of the third embodiment may be used instead of the light-trapping sheet 51.

The light source 14, such as an LED, is provided adjacent to one of the first principal surface 2p and the second principal surface 2q of the light-trapping sheet 51, with the protrusion/depression structure 8 provided on the other. In the present embodiment, the light source 14 is provided adjacent to the first principal surface 2p, and the protrusion/depression structure 8 is provided on the second principal surface 2q. The reflective film 11 is provided on the end faces 2s and 2r of the light-trapping sheet 51. The protrusion/depression structure 8 includes depressed portions and protruding portions whose width is 0.1 μm or more and which may be in a periodic pattern or a random pattern.

The prism sheet 9 is arranged with a gap from the second principal surface 2q so as to oppose the protrusion/depression structure 8. The tetrahedron prisms 10 are arranged adjacent to one another inside the prism sheet 9. The prism sheet 9 may be formed by layering together two triangular prism array sheets orthogonal to each other.

The light 4 output from the light source 14 is taken in through the first principal surface 2p of the light-trapping sheet 51 to be the light 12 that propagates inside the light-trapping sheet 51. Portions of this light are radiated outside as the output light 5d' and 6d' by the protrusion/depression structure 8. The radiated light is condensed through the prisms 10 inside the prism sheet 9 to be light 4a having a substantially parallel wave front.

With the light-emitting device of the present embodiment, it is possible, with a simple and thin configuration, to confine light output from a point light source into a light-trapping sheet, and take out the light as a surface light source.

Sheets of the present disclosure are capable of taking in light over a wide area, and over a wide wavelength range (e.g., the entire visible light range) for every angle of incidence; therefore, light-receiving devices and light-emitting devices using the same are useful in solar cells of high conversion efficiency, and light-receiving and light-emitting devices using the same provide a new form of a lighting or a light source, and are useful as a recycle lighting using the sunlight or light from a lighting, and a high-efficiency backlight.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light-trapping sheet comprising:
   a plurality of light-transmitting sheets each having first and second principal surfaces, the plurality of light-transmitting sheets being in contact with an environmental medium; and
   a plurality of light-coupling structures arranged in an inner portion of each of the plurality of light-transmitting sheets at a first and second distance from the first and second principal surfaces, respectively, wherein:
   each of the plurality of light-coupling structures includes a first light-transmitting layer, a second light-transmitting layer, and a third light-transmitting layer sandwiched therebetween; and
   a refractive index of the first and second light-transmitting layers is smaller than a refractive index of the light-transmitting sheet; a refractive index of the third light-transmitting layer is larger than the refractive index of the first and second light-transmitting layers; and the third light-transmitting layer has a diffraction grating parallel to the first and second principal surfaces of the light-transmitting sheet,
   wherein the plurality of light-coupling structures include a first light-coupling structure and a second light-coupling structure two-dimensionally arranged next to each other on a surface parallel to the first and second principal surfaces, and the first and second light-transmitting layer of the first light-coupling structure and the first and second light-transmitting layer of the second light-coupling structure are spaced apart from each other.

2. The light-trapping sheet of claim 1, wherein the plurality of light-transmitting sheets are layered together.

3. The light-trapping sheet of claim 1, wherein surfaces of the first and second light-transmitting layers that are located opposite to the third light-transmitting layer are parallel to the first and second principal surfaces of the light-transmitting sheets.

4. The light-trapping sheet of claim 1, wherein the third light-transmitting layer of the first light-coupling structure and the third light-transmitting layer of the second light-coupling structure are continuous with each other.

5. The light-trapping sheet of claim 1, wherein the plurality of light-coupling structures are arranged three-dimensionally in an inner portion of the plurality of light-transmitting sheets at a first distance or more and a second distance or more from the first and second principal surfaces, respectively.

6. The light-trapping sheet of claim 1, further comprising a transparent cover sheet opposing the first principal surface or the second principal surface of one of the plurality of light-transmitting sheets located at an outermost surface with a gap interposed therebetween.

7. The light-trapping sheet of claim 1, wherein a pitch of the diffraction grating is 0.1 μm or more and 3 μm or less.

8. The light-trapping sheet of claim 7, wherein:
   surfaces of the first and second light-transmitting layers are each sized so as to circumscribe a circle having a diameter of 100 μm or less; and
   the plurality of light-coupling structures each have a thickness of 3 μm or less.

9. The light-trapping sheet of claim 8, wherein at least two of the plurality of light-coupling structures are different from each other in terms of a direction in which the diffraction grating extends.

10. The light-trapping sheet of claim 8, wherein at least two of the plurality of light-coupling structures are different from each other in terms of a pitch of the diffraction grating.

11. The light-trapping sheet of claim 1, wherein: at least one of the plurality of light-transmitting sheets includes a first area being in contact with the first principal surface and having a thickness equal to the first distance, a second area being in contact with the second principal surface and having a thickness equal to the second distance, a third area sandwiched between the first and second areas, and at least one fourth area provided in the third area and connecting the first area and the second area to each other; the plurality of light-coupling structures are arranged only in the third area excluding the at least one fourth area; and an arbitrary straight line passing through the fourth area is extending along an angle greater than a critical angle, which is defined by the refractive index of the light-transmitting sheet and a refractive index of the environmental medium.

12. The light-trapping sheet of claim 1, wherein in at least one of the plurality of light-coupling structures, thicknesses of the first and second light-transmitting layers are decreased toward an outer edge side away from a center of the light-coupling structure.

13. The light-trapping sheet of claim 1, wherein in at least one of the plurality of light-coupling structures, a protrusion/depression structure whose pitch and height are ⅓ or less of a design wavelength is formed on one of surfaces of the first and second light-transmitting layers that are in contact with the light-transmitting sheet, the first principal surface, and the second principal surface.

14. The light-trapping sheet of claim 1, wherein the refractive index of the first and second light-transmitting layers is equal to a refractive index of the environmental medium.

15. A light-receiving device comprising a light-trapping sheet of claim 1, and a photoelectric conversion section provided on one of a first outermost surface of the light-trapping sheet, a second outermost surface thereof, and end faces adjacent to the first outermost surface and the second outermost principal surface.

16. The light-receiving device of claim 15, further comprising another light-trapping sheet of claim 1, wherein: the photoelectric conversion section is provided on the first outermost surface of the light-trapping sheet; and an end face of the other light-trapping sheet is connected to the second principal surface of the light-trapping sheet provided with the photoelectric conversion section.

17. A light-receiving device comprising a light-trapping sheet of claim 1, a protrusion/depression structure or a prism sheet provided on a first outermost surface or a second outermost surface of the light-trapping sheet, and a photoelectric conversion section for receiving light output from the protrusion/depression structure or the prism sheet.

18. A light-receiving device comprising a light-trapping sheet of claim 1, and a protrusion/depression structure provided on a portion of a first outermost surface or a second outermost surface of the light-trapping sheet.

19. A light-emitting device comprising a light-trapping sheet of claim 1, a light source provided adjacent to one of a first outermost surface and a second outermost surface of the light-trapping sheet, a protrusion/depression structure provided on the other one of the first outermost surface and the second outermost surface of the light-trapping sheet, and a prism sheet arranged so as to receive light output from the protrusion/depression structure.

\* \* \* \* \*